(12) United States Patent
Zeidler et al.

(10) Patent No.: US 11,562,880 B2
(45) Date of Patent: Jan. 24, 2023

(54) PARTICLE BEAM SYSTEM FOR ADJUSTING THE CURRENT OF INDIVIDUAL PARTICLE BEAMS

(71) Applicant: Carl Zeiss MultiSEM GmbH, Oberkochen (DE)

(72) Inventors: Dirk Zeidler, Oberkochen (DE); Hans Fritz, Glottertal (DE); Ingo Mueller, Aalen (DE); Georgo Metalidis, Koenigsbronn-Zang (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 28 days.

(21) Appl. No.: 17/209,626

(22) Filed: Mar. 23, 2021

(65) Prior Publication Data

US 2021/0210303 A1    Jul. 8, 2021

Related U.S. Application Data

(63) Continuation of application No. PCT/DE2019/000196, filed on Jul. 23, 2019.

(30) Foreign Application Priority Data

Sep. 27, 2018   (DE) .......................... 102018007652.1

(51) Int. Cl.
*H01J 37/12* (2006.01)
*H01J 37/153* (2006.01)
(Continued)

(52) U.S. Cl.
CPC ............ *H01J 37/12* (2013.01); *H01J 37/153* (2013.01); *H01J 37/244* (2013.01); *H01J 37/28* (2013.01);
(Continued)

(58) Field of Classification Search
CPC ............ H01J 37/00; H01J 37/02; H01J 37/12; H01J 37/153; H01J 37/244; H01J 37/28;
(Continued)

(56) References Cited

U.S. PATENT DOCUMENTS

| 4,130,761 A | 12/1978 | Matsuda |
| 4,153,843 A | 5/1979 | Pease |

(Continued)

FOREIGN PATENT DOCUMENTS

| DE | 10 2013 014 976 | 3/2015 |
| DE | 10 2014 008 083 B4 | 8/2017 |

(Continued)

OTHER PUBLICATIONS

Translation of International Search Report for corresponding PCT Appl No. PCT/DE2019/000196, dated Jan. 7, 2020.

*Primary Examiner* — Jason L McCormack
(74) *Attorney, Agent, or Firm* — Fish & Richardson P.C.

(57) ABSTRACT

A particle beam system includes: a particle source to generate a beam of charged particles; a first multi-lens array including a first multiplicity of individually adjustable and focusing particle lenses so that at least some of the particles pass through openings in the multi-lens array in the form of a plurality of individual particle beams; a second multi-aperture plate including a multiplicity of second openings downstream of the first multi-lens array so that some of the particles which pass the first multi-lens array impinge on the second multi-aperture plate and some of the particles which pass the first multi-lens array pass through the openings in the second multi-aperture plate; and a controller configured to supply an individually adjustable voltage to the particle lenses of the first multi-lens array and thus individually adjust the focusing of the associated particle lens for each individual particle beam.

24 Claims, 10 Drawing Sheets

(51) Int. Cl.
*H01J 37/244* (2006.01)
*H01J 37/28* (2006.01)

(52) U.S. Cl.
CPC .............. *H01J 2237/0453* (2013.01); *H01J 2237/04924* (2013.01); *H01J 2237/1202* (2013.01); *H01J 2237/1215* (2013.01); *H01J 2237/1532* (2013.01); *H01J 2237/244* (2013.01); *H01J 2237/24564* (2013.01)

(58) Field of Classification Search
CPC .............. H01J 37/04; H01J 2237/0453; H01J 2237/04924; H01J 2237/1202; H01J 2237/1215; H01J 2237/1532; H01J 2237/244; H01J 2237/24564; H01J 2237/1205; H01J 2237/248
USPC ............................... 250/306, 307, 311, 397
See application file for complete search history.

(56) References Cited

U.S. PATENT DOCUMENTS

| | | |
|---|---|---|
| 4,200,794 A | 4/1980 | Newberry |
| 4,338,548 A | 7/1982 | Bono |
| 4,742,234 A | 5/1988 | Feldman |
| 5,215,623 A | 6/1993 | Takahashi |
| 5,864,142 A | 1/1999 | Muraki |
| 5,892,224 A | 4/1999 | Nakasuji |
| 5,905,267 A | 5/1999 | Muraki |
| 5,981,954 A | 11/1999 | Muraki |
| 6,107,636 A | 8/2000 | Muraki |
| 6,124,599 A | 9/2000 | Muraki |
| 6,137,113 A | 10/2000 | Muraki |
| 6,323,499 B1 | 11/2001 | Muraki |
| 6,333,508 B1 | 12/2001 | Katsap |
| 6,617,595 B1 | 9/2003 | Okunuki |
| 6,633,366 B2 | 10/2003 | De Jager |
| 6,696,371 B2 | 2/2004 | Butschke |
| 6,787,780 B2 | 9/2004 | Hamaguchi |
| 6,804,288 B2 | 10/2004 | Haraguchi |
| 6,818,911 B2 | 11/2004 | Tamamori |
| 6,835,508 B2 | 12/2004 | Butschke |
| 6,872,950 B2 | 3/2005 | Shimada |
| 6,903,345 B2 | 6/2005 | Ono |
| 6,903,353 B2 | 6/2005 | Muraki |
| 6,917,045 B2 | 7/2005 | Hashimoto |
| 6,919,574 B2 | 7/2005 | Hashimoto |
| 6,943,349 B2 | 9/2005 | Adamec |
| 6,953,938 B2 | 10/2005 | Iwasaki |
| 6,965,153 B1 | 11/2005 | Ono et al. |
| 6,992,290 B2 | 1/2006 | Watanabe |
| 7,005,658 B2 | 2/2006 | Muraki |
| 7,015,467 B2 | 3/2006 | Maldonado |
| 7,060,984 B2 | 6/2006 | Nagae |
| 7,084,411 B2 | 8/2006 | Lammer-Pachlinger |
| 7,091,504 B2 | 8/2006 | Wieland |
| 7,109,494 B2 | 9/2006 | Ono |
| 7,126,141 B2 | 10/2006 | Ono |
| 7,129,502 B2 | 10/2006 | Kruit |
| 7,244,949 B2 | 7/2007 | Knippelmeyer |
| 7,285,779 B2 | 10/2007 | Litman |
| 7,375,326 B2 | 5/2008 | Sender |
| 7,420,164 B2 | 9/2008 | Nakasuji |
| 7,468,507 B2 | 12/2008 | Rogers |
| 7,504,622 B2 | 3/2009 | Elyasaf |
| 7,535,001 B2 | 5/2009 | Sender |
| 7,601,972 B2 | 10/2009 | Nakasuji |
| 7,619,203 B2 | 11/2009 | Elyasaf |
| 7,696,497 B2 | 4/2010 | Rogers |
| 8,035,082 B2 | 10/2011 | Yamazaki |
| 8,134,135 B2 | 3/2012 | Kruit |
| 8,350,214 B2 | 1/2013 | Otaki |
| 8,362,425 B2 | 1/2013 | Han |
| 8,384,051 B2 | 2/2013 | Ozawa |
| 8,598,525 B2 | 12/2013 | Zeidler |
| 8,618,496 B2 | 12/2013 | Wieland |
| 8,704,192 B2 | 4/2014 | Sano |
| 8,748,842 B2 | 6/2014 | Ohashi |
| 8,779,399 B2 | 7/2014 | Yamanaka |
| 8,829,465 B2 | 9/2014 | Tsunoda |
| 8,963,099 B2 | 2/2015 | Yamada |
| 9,153,413 B2 | 10/2015 | Almogy |
| 9,263,233 B2 | 2/2016 | Zeidler |
| 9,336,981 B2 | 5/2016 | Knippelmeyer |
| 9,336,982 B2 | 5/2016 | Zeidler |
| 9,349,571 B2 | 5/2016 | Kemen |
| 9,368,314 B2 | 6/2016 | Nakasuji |
| 9,530,613 B2 | 12/2016 | Rogers |
| 9,536,702 B2 | 1/2017 | Lang |
| 9,607,805 B2 | 3/2017 | Liu |
| 9,653,254 B2 | 5/2017 | Zeidler |
| 9,702,983 B2 | 7/2017 | Eder |
| 9,922,799 B2 | 3/2018 | Li |
| 9,991,089 B2 | 6/2018 | Mueller |
| 10,062,541 B2 | 8/2018 | Ren |
| 10,141,160 B2 | 11/2018 | Ren |
| 10,354,831 B2 | 7/2019 | Kemen |
| 10,388,487 B2 | 8/2019 | Zeidler |
| 10,535,494 B2 | 1/2020 | Zeidler |
| 10,541,112 B2 | 1/2020 | Schubert |
| 10,586,677 B1 | 3/2020 | Okada |
| 10,600,613 B2 | 3/2020 | Zeidler |
| 10,622,184 B2 | 4/2020 | Knippelmeyer |
| 10,643,820 B2 | 5/2020 | Ren |
| 10,741,355 B1 | 8/2020 | Zeidler |
| 10,811,215 B2 | 10/2020 | Zeidler |
| 10,854,423 B2 | 12/2020 | Sarov |
| 10,879,031 B2 | 12/2020 | Ren |
| 10,896,800 B2 | 1/2021 | Riedesel |
| 2003/0209673 A1 | 11/2003 | Ono et al. |
| 2006/0151696 A1* | 7/2006 | Khursheed ............ H01J 37/265 250/310 |
| 2006/0169910 A1* | 8/2006 | Frosien ............... H01J 37/3177 250/396 ML |
| 2009/0014649 A1 | 1/2009 | Nakasuji |
| 2012/0305798 A1* | 12/2012 | Zonnevylle ............ B82Y 40/00 250/397 |
| 2013/0299697 A1* | 11/2013 | Enyama ................ H01J 37/045 250/306 |
| 2014/0158902 A1 | 6/2014 | Knippelmeyer et al. |
| 2014/0197325 A1* | 7/2014 | Kato ...................... B82Y 10/00 250/396 R |
| 2015/0069235 A1 | 3/2015 | Kemen et al. |
| 2015/0348738 A1 | 12/2015 | Zeidler et al. |
| 2017/0025241 A1 | 1/2017 | Li et al. |
| 2017/0133198 A1 | 5/2017 | Kruit |
| 2019/0333732 A1 | 10/2019 | Ren |
| 2020/0211810 A1 | 7/2020 | Zeidler |
| 2020/0243300 A1 | 7/2020 | Zeidler |
| 2020/0373116 A1 | 11/2020 | Zeidler |
| 2021/0005423 A1 | 1/2021 | Zeidler |
| 2021/0035773 A1 | 2/2021 | Zeidler |

FOREIGN PATENT DOCUMENTS

| | | |
|---|---|---|
| GB | 2519511 A | 4/2015 |
| GB | 2521819 A | 7/2015 |
| JP | 59184524 A | 10/1984 |
| JP | 60042825 A | 3/1985 |
| JP | 60105229 A | 6/1985 |
| JP | 61263217 A | 11/1986 |
| JP | 2014229481 A | 12/2014 |
| JP | 2014-107401 A | 6/2015 |
| WO | WO 2005/024881 A2 | 3/2005 |
| WO | WO 2007/017255 A1 | 2/2007 |
| WO | WO 2007/028595 A2 | 3/2007 |
| WO | WO 2007/060017 A2 | 5/2007 |
| WO | WO 2008/028596 A2 | 3/2008 |
| WO | WO 2011/124352 A1 | 10/2011 |
| WO | WO2013032949 A1 | 3/2013 |
| WO | WO 2018/122176 A1 | 7/2018 |
| WO | WO2020057678 A1 | 3/2020 |
| WO | WO2020064035 A1 | 4/2020 |

(56) References Cited

FOREIGN PATENT DOCUMENTS

| WO | WO2020065094 A1 | 4/2020 |
| WO | WO2020070074 A1 | 4/2020 |
| WO | WO2020151904 A2 | 7/2020 |
| WO | WO2020249147 A1 | 12/2020 |

* cited by examiner

PARTICLE BEAM SYSTEM FOR ADJUSTING THE CURRENT OF INDIVIDUAL PARTICLE BEAMS

CROSS-REFERENCE TO RELATED APPLICATIONS

The present application is a continuation of, and claims benefit under 35 USC 120 to, international application PCT/DE2019/000196, filed Jul. 23, 2019, which claims benefit under 35 USC 119 of German Application No. 10 2018 007 652.1, filed Sep. 27, 2018. The entire disclosure of these applications are incorporated by reference herein.

FIELD

The disclosure relates to particle beam systems which operate with a multiplicity of particle beams.

BACKGROUND

Just like single-beam particle microscopes, multi-beam particle microscopes can be used to analyze objects on a microscopic scale. Images of an object that represent a surface of the object, for example, can be recorded using these particle microscopes. In this way, for example the structure of the surface can be analyzed. While in a single-beam particle microscope a single particle beam of charged particles, such as, for example, electrons, positrons, muons or ions, is used to analyze the object, in a multi-beam particle microscope, a plurality of particle beams are used for this purpose. In general, the plurality of the particle beams, also referred to as a bundle, are directed at the surface of the object at the same time, as a result of which a significantly larger area of the surface of the object can be sampled and analyzed as compared with a single-beam particle microscope within the same period of time.

WO 2005/024 881 A2 discloses a multiple particle beam system in the form of an electron microscopy system which operates with a multiplicity of electron beams in order to scan an object to be examined using a bundle of electron beams in parallel. The bundle of electron beams is generated by an electron beam generated by an electron source being directed at a multi-aperture plate having a multiplicity of openings. Some of the electrons of the electron beam impinge on the multi-aperture plate and are absorbed there and another portion of the beam passes through the openings in the multi-aperture plate, and so an electron beam is shaped in the beam path downstream of each opening, the cross section of the electron beam being defined by the cross section of the opening. Furthermore, suitably chosen electric fields provided in the beam path upstream and/or downstream of the multi-aperture plate have the effect that each opening in the multi-aperture plate acts as a lens on the electron beam passing through the opening, and so the electron beams are focused in a plane situated at a distance from the multi-aperture plate. Typically, the plane in which the foci of the electron beams are formed is imaged by a downstream optical unit onto the surface of the object to be examined, such that the individual electron beams impinge the object in a focused manner as primary beams. There they generate interaction products, such as backscattered electrons or secondary electrons, emanating from the object, which are shaped to form secondary beams and are directed at a detector by a further optical unit. There each of the secondary beams impinges a separate detector element such that the electron intensities detected by the detector element provide information relating to the object at the location at which the corresponding primary beam impinges the object. The bundle of primary beams is scanned systematically over the surface of the object in order to generate an electron micrograph of the object in the manner that is customary for scanning electron microscopes.

In the multiple particle beam system described, a high resolution and a high throughput is often highly relevant for the satisfactory and successful use in practice. In this context, it is usually desirable, inter alia, to set the intensity of the particle beams.

US 2017/0025241 A1 discloses a multi-beam particle beam system, in which the current density within the particle beams is variable. Specifically, the irradiance is set herein, before multi-beams are even formed from the primary electron beam. To set the irradiance, a double collimator is used as per US 2017/0025241 A1, the double collimator being arranged directly downstream of the electron source in the beam direction. By varying the lens excitation of the double collimator, it is possible to vary the current density of the electrons which pass the openings in a multi-aperture plate downstream of the double collimator.

However, the above-described multi-beam particle beam system can reach its limits if the number of utilized particle beams is increased further. Obtaining sufficient beam intensities for the individual beams can involve using as many particles from the particle source as possible. However, in that case the emission characteristic of the particle source can become more important, more precisely the uniformity of the emission characteristic over the entire utilized emission angle. When using relatively large emission angles, the emission characteristic of particle sources, e.g., of thermal field emission (TFE) sources, may no longer be uniform throughout. Accordingly, the irradiance at a first multi-aperture plate in a corresponding particle beam system may also no longer be uniform throughout and there can be relatively large variations in the current densities in different individual beams. However, in the case of multi-particle inspection systems, it is generally desired that there is only a small variation in the current strengths between the various individual beams, which is typically less than a few percent, so that all individual image fields of the multi-image field are scanned with an equivalent number of particles or electrons. By way of example, this is usually a precondition to obtain individual images with approximately the same brightness. The obtainable resolution of the individual images can also depend on the individual beam current.

SUMMARY

In the case of inspection systems operating with multi-beam particle systems, the use of particle sources with large emission angles therefore can represent a challenge on account of the varying emission characteristic.

The present disclosure seeks to provide a particle beam system that works with a multiplicity of individual beams, the particle beam system ensuring a great beam uniformity of individual beams, even if a large number of individual beams is used or if a large emission angle of a particle source is utilized. For example, it can be desirable for the particle beam system to be suitable for multi-beam inspection systems.

In a general aspect, the disclosure provides a particle beam system including the following: at least one particle source, which is configured to generate a beam of charged particles; a first multi-lens array, which includes a first multiplicity of individually adjustable and focusing particle lenses and which is arranged in the beam path of the particles in such a way that at least some of the particles pass through openings in the multi-lens array in the form of a plurality of individual particle beams; a second multi-aperture plate, which includes a multiplicity of second openings and which is arranged in the beam path of the particles downstream of the first multi-lens array in such a way that some of the particles which pass the first multi-lens array impinge the second multi-aperture plate and are absorbed there and some of the particles which pass the first multi-lens array pass through the openings in the second multi-aperture plate; and a controller which is configured to supply an individually adjustable voltage to the particle lenses of the first multi-lens array and thus individually adjust the focusing of the associated particle lens for each individual particle beam.

Thus, according to the disclosure, at least one particle source is provided, although it is also possible for a plurality of particle sources to be provided. The charged particles can be, e.g., electrons, positrons, muons or ions or other charged particles. Optionally, the charged particles are electrons generated, e.g., using a thermal field emission source (TFE). However, other particle sources can also be used.

Within the scope of this patent application, a distinction is made throughout between multi-aperture plates on the one hand and multi-lens arrays on the other hand. A multi-aperture plate is a plate with a multiplicity of openings. Here, it is possible that a voltage is applied to this multi-aperture plate overall. This can but need not be the case. In any case, all openings in a multi-aperture plate have a uniform, globally identical electric and magnetic potential. By contrast, a multi-lens array within the scope of this patent application is—in comparison with a multi-aperture plate—a more complex component: Within the scope of this patent application, a multi-lens array includes a multiplicity of lenses arranged substantially parallel to one another, which are each adjustable individually and independently of one another such that the individual lenses of the lens array can have different refractive powers from one another and these refractive powers can be varied, independently of one another, on an individual basis for each lens.

A multi-lens array according to the disclosure includes the following according to an embodiment variant: a lens multi-aperture plate with a multiplicity of openings; and a multiplicity of electrodes, wherein at each of the multiplicity of openings at least one of the multiplicity of electrodes is arranged in a manner insulated from the lens multi-aperture plate in order to individually influence the individual particle beam passing through the respective opening. The electrodes are ring electrodes according to an embodiment variant; however, other embodiment variants are also possible. It is likewise possible to apply the same voltage to all electrodes in the case of azimuthally divided electrodes, such as, e.g., a quadrupole or octupole. Further, it is possible to bring about the focusing effect by coils which enclose each opening of the lens multi-aperture plate in a plane perpendicular to the beam direction. For deflecting coils, this is described in DE 10 2014 008 083 B4.

According to embodiments of the disclosure, the charged particles initially pass through the first multi-lens array and only then pass through the second multi-aperture plate. What can be important here is that some of the particles which have passed the first multi-lens array impinge the second multi-aperture plate and are absorbed there and some of the particles which have passed the first multi-lens array pass through the openings of the second multi-aperture plate. Thus, some of the particles are cut out of the respective individual particle beam or blocked with the aid of the second multi-aperture plate. How many particles these are now depends in turn on the focusing effect of the particle lenses in the first multi-lens array. If the first multi-lens array exerts a strongly focusing effect on the particles, for example, the beam diameter of the individual particle beams is comparatively small upon arrival at the second multi-aperture plate, which is why more particles can then pass through the second multi-aperture plate and fewer particles are blocked. In the reverse case of a less strongly focusing setting of the particle lenses or even in the case of lack of focusing, more particles are blocked upon incidence on the second multi-aperture plate and fewer particles pass through the openings of the second multi-aperture plate. This allows the current density or, ultimately, the number of charged particles per individual beam downstream of the second multi-aperture plate to be set by way of the individual adjustment of the focus settings in the particle lenses of the first multi-lens array.

The controller which is configured to supply an individually adjustable voltage to the particle lenses of the first multi-lens array and thus to individually adjust the focusing of the associated particle lens for each individual particle beam can be embodied in one or more parts. If a plurality of multi-lens arrays are present in the particle beam system, a central controller for all multi-lens arrays can be provided for controlling all multi-lens arrays in accordance with one embodiment variant. However, it is also possible to use a separate controller for each multi-lens array. Overall, the controller is normally integrated in a computer system which controls the entire particle beam system.

The openings in a multi-aperture plate, for example in a second multi-aperture plate, and the openings in a multi-lens array, for example in the first multi-lens array, can have a regular arrangement, for example in a checkerboard-like or hexagonal pattern. Here, the openings within a multi-lens array can be identical or have the same diameter; optionally they are circular. An analog statement applies to the openings in a multi-aperture plate. However, deviations from this regular and identical shape are also possible. According to an embodiment variant of the disclosure, multi-aperture plates and multi-lens arrays, for example the first multi-lens array and, for example, the second multi-aperture plate, can have more than 10 openings, such as more than 50 or 90, and optionally more than 100 openings. According to an embodiment variant of the disclosure, 91 openings are present for 91 particle beams or 127 openings are present for 127 individual particle beams or $3n(n-1)+1$ openings are present in the general case and may be arranged hexagonally to one another, where n is any natural number.

According to an embodiment variant of the disclosure, the particle beam system furthermore includes a first multi-aperture plate which has a multiplicity of first openings and which is arranged in the beam path of the particles upstream of the first multi-lens array and assigned to the first multi-lens array, wherein a diameter of the first openings is smaller than a diameter of the openings in the first multi-lens array such that particles which pass through the first multi-aperture plate also pass through the first multi-lens array. Thus, the first multi-aperture plate prevents charged particles from impinging regions of the first multi-lens array which are not openings. Consequently, unintentional charging of the surface of the first multi-lens array is efficiently prevented. In this case, the centers of the first openings in the first multi-aperture plate are normally arranged precisely over the centers of the openings in the first multi-lens array. This improves the precision of the particle beam system overall. However, it is naturally also possible to choose an arrangement deviating therefrom provided that the protective function for the first multi-lens array is maintained.

According to a further embodiment of the disclosure, the particle beam system furthermore includes a second multi-lens array which has a second multiplicity of individually adjustable and focusing particle lenses and which is arranged in the beam path of the particles downstream of the first multi-lens array in such a way that at least some of the particles of the individual particle beams that pass through the first multi-lens array also pass through the second multi-lens array, wherein there are appropriate assignments to the lenses of the first and second multi-lens array for the individual particle beams. Here, the controller is furthermore set up to supply an individually adjustable voltage to the particle lenses of the second multi-lens array and thus individually set the focusing of the associated particle lens for each individual particle beam.

The second multi-lens array substantially has a corrective function. If an individual particle beam which passes a focusing particle lens in the first multi-lens array is considered, the position of the focus or of the focal length changes for this individual particle beam on account of the focusing effect of the particle lens in the first multi-lens array. As a consequence, the individual particle beam may no longer be cleanly imaged on an intermediate image plane. If a further focusing particle lens is now disposed downstream of the particle lens of the first multi-lens array, the further focusing particle lens being provided in the second multi-lens array in this case, this can once again achieve exact focusing of individual particle beam on the intermediate image plane. If the entire field of individual particle beams and the occurring focusing or defocusing effects are now considered, field curvature possibly present can therefore be corrected overall with the aid of the second multi-lens array.

According to an embodiment variant of the disclosure, the second multi-lens array is arranged in the beam path downstream of the second multi-aperture plate. Thus, what is the case here is that only some of the particles of the individual particle beams that have passed through the first multi-lens array can also pass through the second multi-lens array since the second multi-aperture plate is used in any case to block some of the particles of the individual particle beams. The second multi-aperture plate can in this case also protect the second multi-lens array from unintentional charging by charged particles incident thereon.

According to an alternative embodiment variant of the disclosure, the second multi-lens array is arranged in the beam path upstream of the second multi-aperture plate. Then, in this case, substantially all particles of the individual particle beams that have passed through the first multi-lens array can also pass through the second multi-lens array. Then, charged particles are only cut out or blocked after the passage through the second multi-lens array.

According to a further embodiment of the disclosure, a diameter of the second openings in the second multi-aperture plate is smaller than a diameter of the openings in the second multi-lens array. If the second multi-lens array is arranged downstream the second multi-aperture plate, this dimensioning of the respective openings can implement efficient protection for the second multi-lens array. Moreover, possibly present lens defects, for example spherical aberrations, can have a less impairing effect.

According to a further embodiment of the disclosure, the particle beam system furthermore includes a multiple condenser, for example a double condenser. According to an embodiment variant of the disclosure, the first multi-lens array is arranged in the beam path downstream of the multiple condenser or double condenser and upstream of the second multi-aperture plate. In this case, the particle beams encountering the first multi-lens array already can extend substantially in parallel. However, it is also possible for the first multi-lens array to already be arranged in the beam path upstream of the multiple condenser or double condenser. An early current adjustment or masking of charged particles in the beam path can reduce the particle density per beam and reduces the Coulomb effect. However, if the first multi-lens array is arranged upstream of the double or multiple condenser, it can be desirable for the structure to take account of the non-parallel illumination in that case.

According to a further embodiment variant, the first multi-aperture plate is arranged between constituent parts of the multiple condenser, for example within the double condenser, and the first multi-lens array is arranged downstream of the multiple condenser, for example double condenser, and upstream of the second multi-aperture plate. Thus, even if the first multi-aperture plate and the first multi-lens array were considered functionally to be a unit, constituent parts of this unit, specifically the first multi-aperture plate on the one hand and the first multi-lens array on the other hand, can be arranged variably with respect to one another or at a distance from one another within the entire particle beam system. This can allow possibly existing structural boundary conditions to be taken into account more easily.

According to a further embodiment of the disclosure, a particle-optical lens for focusing the individual particle beams on an intermediate image plane is furthermore provided in the particle beam system. This particle-optical lens can be embodied in one or more parts. By way of example, the particle-optical lens for focusing the individual particle beams on the intermediate image plane could be one or more additional field lenses. In this case, additional means that a further component is actually present in addition to the aforementioned components such as lenses and lens types. However, it is also possible, for example, that the particle-optical lens for focusing the individual particle beams on the intermediate image plane is formed by the second multi-lens array or, more generally, by a further multi-lens array. To this end, it may then be desirable to choose a correspondingly high refractive power of the particle lenses of the second or the further multi-lens array.

According to an embodiment of the disclosure, the first multi-lens array and the second multi-aperture plate are arranged in the beam path upstream of the intermediate image plane. This form of arrangement can facilitate a compact structure of the particle beam system.

According to a further embodiment variant of the disclosure, the first multi-lens array and the second multi-aperture plate are arranged in the beam path downstream of the intermediate image plane. This can allow structures with relatively large spatial requirements to be realized and there normally is imaging of the individual particle beams on a further intermediate image plane.

According to an alternative embodiment variant of the disclosure, the individually adjustable voltages of the particle lenses and hence the refractive power of the first multi-lens array are chosen in such a way that a further intermediate image arises between the first multi-lens array and the second multi-lens array. In this embodiment variant it is possible to realize an embodiment with telescope optics, particularly when using a third multi-lens array.

According to a further embodiment of the disclosure, the particle beam system furthermore includes a third multi-lens array which has a third multiplicity of individually adjustable and focusing particle lenses and which is arranged in the beam path of the particles downstream of the first multi-lens array and downstream of the second multi-lens array in such a way that at least some of the particles of the individual particle beams that pass through the first and the second multi-lens array also pass through the third multi-lens array, wherein there are appropriate assignments to the lenses of the first, second and third multi-lens array for the individual particle beams. Furthermore, the controller can be configured to supply an individually adjustable voltage to the particle lenses of the third multi-lens array and thus individually set the focusing of the associated particle lens for each individual particle beam. The aforementioned telescope optics can be realized well with the aid of this embodiment variant. Here, the third multi-lens array can also be used to correct field curvature possibly present. Once again depending on the refractive power of the particle lenses of the third multi-lens array, an additional field lens for focusing the individual particle beams on an intermediate image plane may be desired or can be dispensed with.

According to a further embodiment variant of the disclosure, the particle beam system furthermore includes a fourth multi-aperture plate which has a multiplicity of fourth openings and a fourth multi-lens array which has a fourth multiplicity of focusing particle lenses and which is arranged in the beam path of the particles downstream of the fourth multi-aperture plate. Here, the fourth multi-aperture plate and the fourth multi-lens array can be arranged in the beam path on the source side of the first multi-lens array and can be arranged with respect to one another in such a way that particles which pass through the fourth multi-aperture plate also pass through the fourth multi-lens array. Furthermore, the controller can be configured to supply an individually adjustable voltage to the particle lenses of the fourth multi-lens array and thus individually set the focusing of the associated particle lens for each individual particle beam. The described embodiment variant can be particularly suitable for those particle beam systems in which the current adjustment of the individual particle beams is carried out after imaging on an intermediate image plane.

In principle, it is also possible to use further multi-lens arrays analogously to the above-described variants in the particle beam system according to the disclosure. These can be provided—depending on requirements—with an associated multi-aperture plate. In this case, it is then possible, for example, for each multi-aperture plate arranged upstream of the associated multi-lens array to protect the multi-lens array from unintentional charging by charged particles.

According to a further embodiment of the disclosure, the particle beam system furthermore includes a measuring device for measuring the current of the individual particle beams, for example for measuring the current in the region of an object plane. Instead of carrying out measurements in the region or vicinity of the object plane, the current of each individual particle beam can be measured in the vicinity of an intermediate image plane or at any other point in the illumination column where the beams are spatially separated from one another. By way of example, the measuring device can include at least one current-sensitive sensor, for example at least one Faraday cup, which can be introduced into the beam path. The current sensor can be provided with a stop which only lets particles from a certain area perpendicular to the beam direction reach the sensor. Optionally, the maximal lateral extent, for example the stop diameter in the case of a round stop, will be smaller than the pitch of the beams at the measuring point. By way of example, a stop diameter of 20 µm, 10 µm, or 5 µm can be chosen at the object. By way of example, the current sensor can be mounted on a displacement stage which moves the current sensor substantially perpendicular to the beam path. The positions of all individual particle beams can then be approached in succession such that exactly one beam passes the stop in each case. Current sensor and displacement stage can be controlled by a computer system, for example by a central computer system. Thus, it is possible to determine a value of the current for each individual particle beam. Then, these values for the current can naturally also be determined as a function of the excitation values of the lenses of a multi-lens array MLA.

According to an embodiment of the disclosure, the measuring device is set up in such a way that a measurement of the current can be implemented for a multiplicity of the individual particle beams at the same time. This can allow a faster measurement and then, on the basis thereof, a faster adjustment of the current as well. In this embodiment, the measuring device can include, for example, a multiplicity of current sensors and a multiplicity of stops which are arranged in space in such a way that each individual particle beam passes exactly one stop and is captured by exactly one current sensor. If the number of sensors and stops is less than the number of individual particle beams, the displacement stage accordingly may be moved less frequently. If the number of sensors and stops is greater than or equal to the number of individual particle beams, the displacement stage may need not be moved during the measurement of the current. Alternatively, all individual particle beams can also be applied to a differently arranged, spatially resolving current sensor, for example a 2-dim CCD, and the current per individual particle beam can be determined, for example, by integrating the CCD signal of the CCD pixel related to the beam.

In a general aspect, the disclosure provides a method of closed-loop current adjustment for individual particle beams of a particle beam system as described above in a plurality of embodiment variants. Here, the method includes the following step: adjusting individual beam currents for a plurality of individual particle beams, for example for all individual particle beams, with the aid of the first multi-lens array. To set the individual beam currents, the controller of the particle beam system can supply an appropriate voltage to the particle lenses of the first multi-lens array, as a result of which the individual particle beam is focused more or less strongly. In accordance with the focusing setting, an appropriate particle number can then be blocked or masked at the second multi-aperture plate arranged in the beam path downstream the first multi-lens array.

In accordance with an embodiment of the disclosure, the method furthermore includes the following step: correcting a focal length of the individual particle beams with the aid of the second or a further multi-lens array.

By way of example, correcting the focal lengths can serve to correct focus positions altered after the individual beam currents have been set to focus positions to be specified. By way of example, the latter can be the original focus positions or focus positions that compensate field curvature in the primary path in advance. For correction purposes, the controller of the particle beam system can once again supply an appropriate voltage to the particle lenses of the second or a further multi-lens array, as a result of which appropriate focusing is once again achieved in an individual fashion for the individual particle beams. Optionally, the multi-lens array used for correction purposes is located in the beam path downstream the first multi-lens array and/or downstream the second multi-aperture plate; however, it can also be situated upstream thereof. Accordingly, the correcting multi-lens array can be the second multi-lens array; however, this is not mandatory and a different multi-lens array can also be used.

In accordance with an embodiment of the disclosure, the method furthermore includes the following step: adjusting a desired focal length of the individual particle beams with the aid of the second or the further multi-lens array before adjusting the individual beam currents.

Thus, in this embodiment variant the focal length can be adjusted first, before actual adjusting of the individual currents is started. This procedure can create simpler initial conditions for the subsequent adjustment of the current with a focal correction and simplifies the final correction.

In accordance with an embodiment of the disclosure, the method furthermore includes the following steps: measuring individual beam currents for a plurality of individual particle beams, for example for all individual particle beams; and using the measurement values for adjusting the individual beam currents. By way of example, the measurement can be implemented with the above-described measuring device. Then, the measurement values can be evaluated automatically or using software. Then, a correction of the individual beam current can arise in each case for the individual beams therefrom and a voltage supply is once again accordingly provided for each of the multi-lenses by way of the controller.

According to an embodiment of the disclosure, the method is carried out multiple times and, for example, iteratively in full or in part. In this way, the best possible adjustment for the current can result stepwise.

In a general aspect, the disclosure provides a particle beam system including the following: at least one particle source, which is configured to generate a beam of charged particles; a first multi-stigmator array, which includes a first multiplicity of individually adjustable first stigmators and which is arranged in the beam path of the particles in such a way that at least some of the particles pass through openings in the multi-stigmator array in the form of a plurality of individual particle beams; a second multi-aperture plate, which includes a multiplicity of second openings and which is arranged in the beam path of the particles downstream of the first multi-stigmator array and arranged in such a way that some of the particles which pass the first multi-stigmator array impinge the second multi-aperture plate and are absorbed there and some of the particles which pass the first multi-stigmator array pass through the openings in the second multi-aperture plate; a second multi-stigmator array which includes a second multiplicity of individually adjustable second stigmators and which is arranged in the beam path of the particles downstream of the second multi-aperture plate in such a way that at least some of the particles which pass through the second multi-aperture plate also pass through the second multi-stigmator array; and a controller which is configured to supply respective individually adjustable voltages to the stigmators of the first multi-stigmator array and the stigmators of the second multi-stigmator array for the purposes of generating multipole fields, for example quadrupole or octupole fields, and therefore individually set an astigmatism in the associated stigmators for each individual particle beam, wherein the voltages are chosen in such a way that astigmatism settings of the stigmators of the first multi-stigmator array are in each case compensated by opposite astigmatism settings of related stigmators in the second multi-stigmator array.

A feature of using multi-stigmator arrays in the manner specified above in comparison with a multi-lens array with a focusing effect can lie in the fact that lower voltages are required for influencing individual particle beams. However, work needs to be carried out with two components, i.e., two multi-stigmator arrays, instead of with one component, i.e., a single multi-lens array.

The described embodiment variants of the disclosure can be combined in full or in part with one another, provided that no technical contradictions arise as a result.

BRIEF DESCRIPTION OF THE DRAWINGS

The disclosure will be understood even better with reference to the accompanying figures, in which.

DETAILED DESCRIPTION

Figure 1:
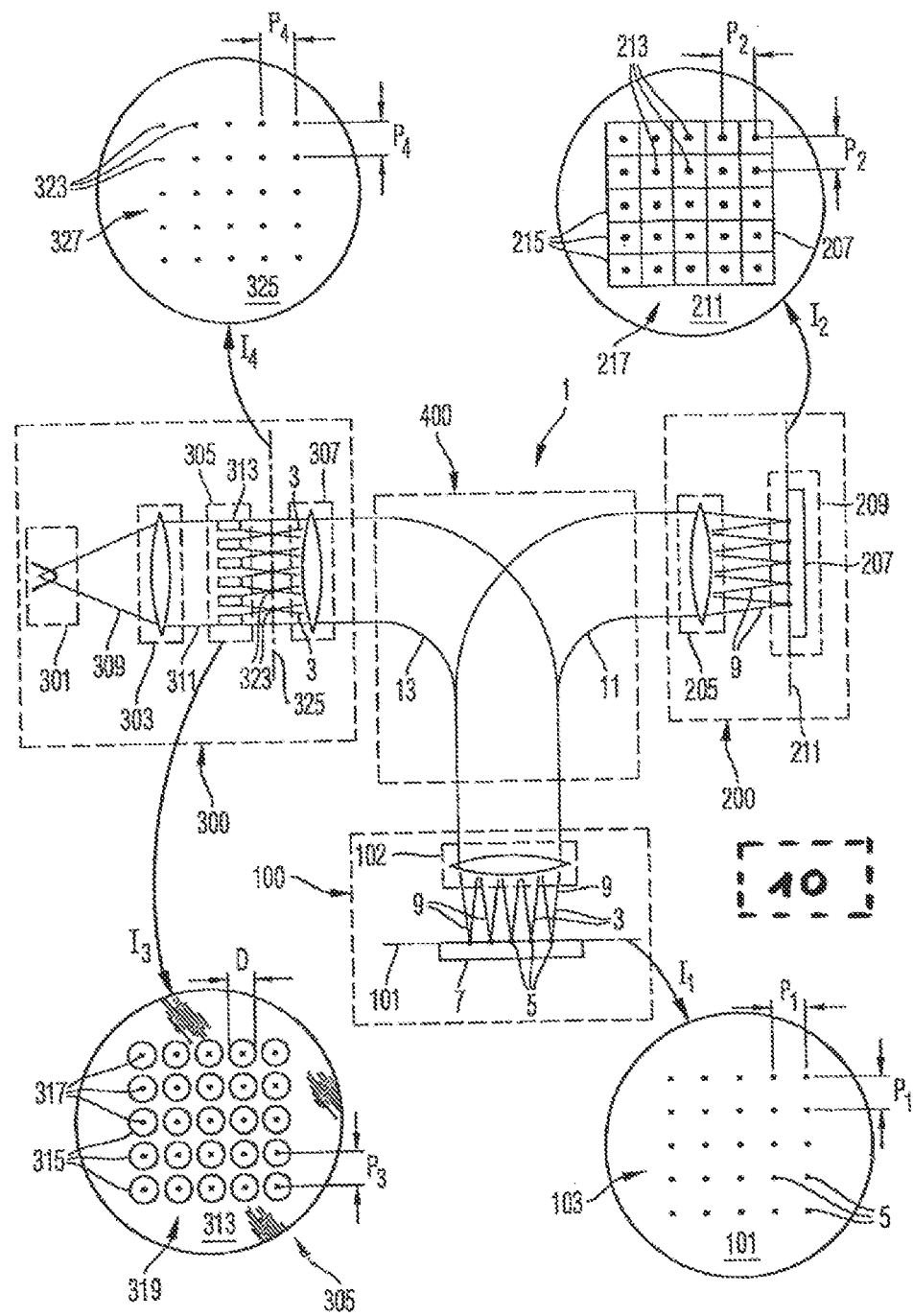
FIG. 1 shows a schematic illustration of a multi-beam particle microscope.

FIG. 1 is a schematic illustration of a particle beam system 1 in the form of a multi-beam particle microscope 1, which uses a multiplicity of particle beams. The particle beam system 1 generates a multiplicity of particle beams which impinge an object to be examined in order to generate there interaction products, e.g. secondary electrons, which emanate from the object and are subsequently detected. The particle beam system 1 is of the scanning electron microscope (SEM) type, which uses a plurality of primary particle beams 3 which are incident on a surface of the object 7 at a plurality of locations 5 and generate there a plurality of electron beam spots, or spots, that are spatially separated from one another. The object 7 to be examined can be of any desired type, e.g. a semiconductor wafer or a biological sample, and include an arrangement of miniaturized elements or the like. The surface of the object 7 is arranged in a first plane 101 (object plane) of an objective lens 102 of an objective lens system 100.

The enlarged excerpt $I_1$ in FIG. 1 shows a plan view of the object plane 101 having a regular rectangular field 103 of locations of incidence 5 formed in the first plane 101. In FIG. 1, the number of locations of incidence is 25, which form a 5×5 field 103. The number 25 of locations of incidence is a number chosen for reasons of simplified illustration. In practice, the number of beams, and hence the number of sites of incidence, can be chosen to be significantly greater, such as, for example, 20×30, 100×100 and the like.

In the embodiment illustrated, the field 103 of locations of incidence 5 is a substantially regular rectangular field having a constant pitch $P_1$ between adjacent locations of incidence. Exemplary values of the pitch $P_1$ are 1 micrometer, 10 micrometers and 40 micrometers. However, it is also possible for the field 103 to have other symmetries, such as a hexagonal symmetry, for example.

A diameter of the beam spots shaped in the first plane 101 can be small. Exemplary values of the diameter are 1 nanometer, 5 nanometers, 10 nanometers, 100 nanometers and 200 nanometers. The focusing of the particle beams 3 for shaping the beam spots 5 is carried out by the objective lens system 100.

The primary particles impinging the object generate interaction products, e.g., secondary electrons, back-scattered electrons or primary particles that have experienced a reversal of movement for other reasons, which emanate from the surface of the object 7 or from the first plane 101. The interaction products emanating from the surface of the object 7 are shaped by the objective lens 102 to form secondary particle beams 9. The particle beam system 1 provides a particle beam path 11 for guiding the multiplicity of secondary particle beams 9 to a detector system 200. The detector system 200 includes a particle-optical unit with a projection lens 205 for directing the secondary particle beams 9 at a particle multi-detector 209.

The excerpt $I_2$ in FIG. 1 shows a plan view of the plane 211, in which individual detection regions of the particle multi-detector 209 on which the secondary particle beams 9 are incident at the locations 213 are located. The locations of incidence 213 lie in a field 217 with a regular pitch $P_2$ with respect to one another. Exemplary values of the pitch $P_2$ are 10 micrometers, 100 micrometers and 200 micrometers.

The primary particle beams 3 are generated in a beam generating apparatus 300 including at least one particle source 301 (e.g., an electron source), at least one collimation lens 303, a multi-aperture arrangement 305 and a field lens 307. The particle source 301 generates a diverging particle beam 309, which is collimated or at least substantially collimated by the collimation lens 303 in order to shape a beam 311 which illuminates the multi-aperture arrangement 305.

The excerpt 13 in FIG. 1 shows a plan view of the multi-aperture arrangement 305. The multi-aperture arrangement 305 includes a multi-aperture plate 313, which has a plurality of openings or apertures 315 formed therein. Midpoints 317 of the openings 315 are arranged in a field 319 that is imaged onto the field 103 formed by the beam spots 5 in the object plane 101. A pitch $P_3$ between the midpoints 317 of the apertures 315 can have exemplary values of 5 micrometers, 100 micrometers and 200 micrometers. The diameters D of the apertures 315 are smaller than the pitch $P_3$ between the midpoints of the apertures. Exemplary values of the diameters D are $0.2 \times P_3$, $0.4 \times P_3$ and $0.8 \times P_3$.

Particles of the illuminating particle beam 311 pass through the apertures 315 and form particle beams 3. Particles of the illuminating beam 311 which impinge the plate 313 are absorbed by the latter and do not contribute to the formation of the particle beams 3.

On account of an applied electrostatic field, the multi-aperture arrangement 305 focuses each of the particle beams 3 in such a way that beam foci 323 are formed in a plane 325. A diameter of the beam foci 323 can be, for example, 10 nanometers, 100 nanometers and 1 micrometer.

The field lens 307 and the objective lens 102 provide a first imaging particle-optical unit for imaging the plane 325, in which the beam foci are formed, onto the first plane 101 such that a field 103 of locations of incidence 5 or beam spots arises there. Should a surface of the object 7 be arranged in the first plane, the beam spots are correspondingly formed on the object surface.

The objective lens 102 and the projection lens arrangement 205 provide a second imaging particle-optical unit for imaging the first plane 101 onto the detection plane 211. The objective lens 102 is thus a lens which is part of both the first and the second particle-optical unit, while the field lens 307 belongs only to the first particle-optical unit and the projection lens 205 belongs only to the second particle-optical unit.

A beam switch 400 is arranged in the beam path of the first particle-optical unit between the multi-aperture arrangement 305 and the objective lens system 100. The beam switch 400 is also part of the second optical unit in the beam path between the objective lens system 100 and the detector system 200.

Further information concerning such multi-beam particle beam systems and components used therein, such as, for instance, particle sources, multi-aperture plates and lenses, can be obtained from the international patent applications WO 2005/024881, WO 2007/028595, WO 2008/028596, WO 2011/124352 and WO 2007/060017 and the German patent applications having the application numbers DE 10 2013 026 113.4 and DE 10 2013 014 976.2, the disclosure of which in the full scope thereof is incorporated by reference in the present application.

The multi-beam particle beam system furthermore includes a computer system 10 configured both for controlling the individual particle optical components of the multi-beam particle beam system and for evaluating and analyzing the signals obtained by the multi detector 209. In this case, the computer system 10 can be constructed from a plurality of individual computers or components. Here, the computer system 10 can also be connected to the controller 550 for the first multi-lens array and for optionally present further multi-lens arrays and/or multi-stigmator arrays and/or can include corresponding controllers. Furthermore, the computer system 10 can be connected to, or include, a measuring device for measuring the current of the individual particle beams.

With the aid of this measuring device, it is possible measure the current of each individual particle beam in the vicinity of the object plane 7 or in the vicinity of the intermediate image plane 325 or at any other point in the illumination column where the beams are spatially separated from one another. To this end, a current-sensitive sensor, for example a Faraday cup, can be introduced into the beam path. The current sensor can include a stop which only lets particles from a certain area perpendicular to the beam direction reach the sensor. Optionally, the maximal lateral extent, for example the stop diameter in the case of a round stop, is smaller than the pitch of the beams at the measuring point. When measuring the current in the object plane, the stop diameter can be, for example, 20 µm, 10 µm, 5 µm (e.g., between 5 and 20 µm). By way of example, the current sensor can be mounted on a displacement stage which moves the current sensor substantially perpendicular to the beam path. The positions of all individual particle beams 3 can be approached in succession such that exactly one beam passes the stop in each case. Current sensor and displacement stage are controlled by the computer system 10. Thus, it is possible to determine a value of the current for each individual particle beam 3. Then, these values for the current can naturally also be determined as a function of the excitation values of the lenses of a multi-lens array MLA.

Instead of successively measuring the values for the current for each individual particle beam 3, the values for the current can also be determined parallel in time, for example by a multiplicity of current sensors and a multiplicity of stops which are spatially arranged in such a way that each individual particle beam 3 passes exactly one stop and is captured by exactly one current sensor. If the number of sensors and stops is greater than one but less than the number of individual particle beams 3, the displacement stage accordingly needs to be moved less frequently during the measurement of the current. If the number of sensors and stops is greater than or equal to the number of individual particle beams 3, the displacement stage need not be moved during the measurement of the current. Alternatively, all individual particle beams 3 can also be applied to a differently arranged, spatially resolving current sensor, for example a 2-dim CCD, and the current per individual particle beam can be determined, for example, by integrating the CCD signal of the CCD pixel related to the beam.

Figure 2:
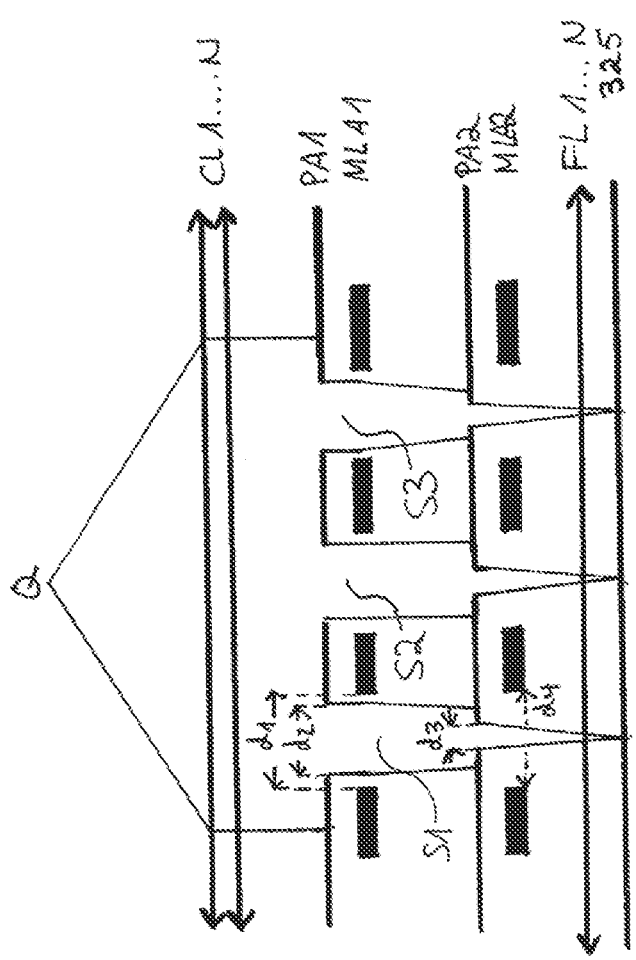
FIG. 2 shows a schematic diagram for a current adjustment of individual particle beams in accordance with a first embodiment.

FIG. 2 shows a schematic diagram for a current adjustment of individual particle beams in accordance with a first embodiment. The schematic diagram is not true to scale and only intended to elucidate basic aspects of the disclosure. In the shown exemplary case, the particle beam system includes a particle source Q, which is configured to generate a beam of charged particles, for example electrons in this case. Here, a divergent election beam is initially generated, the latter then encountering a multiple condenser, for example a double condenser CL1 . . . N. In the beam direction of the particles emerging from the particle source Q, the embodiment includes a first multi-aperture plate PA1, a first multi-lens array MLA1, a second multi-aperture plate PA2, a second multi-lens array MLA2 and a field lens system FL1 . . . N downstream of the multiple condenser CL1 . . . N.

After passing the double condenser CL1 . . . N, the election beam initially impinges the first multi-aperture plate PA1, which has a multiplicity of first openings through which the electron beam then passes. Thus, a plurality of individual particle beams S1, S2, S3 are present after passing through the first multi-aperture plate PA1. These individual particle beams S1, S2, S3 then pass the first multi-lens array MLA1. As a result of the first multi-aperture plate PA1 being arranged in the beam path of the particles upstream of the first multi-lens array MLA1 and as a result of the diameter $d_2$ of the openings in the first multi-aperture plate PA1 being smaller than the diameter $d_1$ of openings in the first multi-lens array MLA1, all particles that pass through the first multi-aperture plate PA1 also pass through the first multi-lens array MLA1. Thus, the first multi-aperture plate PA1 has a protective effect and prevents inadvertent incidence on or inadvertent charging of the first multi-lens array MLA1. Moreover, this dimensioning of the openings contributes to keeping the effects of possibly present lens defects, for example spherical aberrations, of the first multi-lens array MLA1 as small as possible.

The first multi-lens array MLA1 includes a multiplicity of individually adjustable and focusing particle lenses. Thus, the focusing effect on each individual particle beam S1, S2, S3 can be chosen differently. In the example shown, the focusing effect is comparatively weak on the individual particle beam S1 and comparatively strong on the individual particle beam S3, while no focusing effect whatsoever is exerted on the individual particle beam S2. As a result, the beam diameter of the individual particle beams S1, S2, S3 and hence the illumination spot resulting from the respective individual particle beams are different for each individual particle beam S1, S2, S3 when the latter are incident on the second multi-aperture plate PA2. The individual particle beam S2, which experiences no further focusing by the particle lens of the first multi-lens array MLA1 assigned thereto, has the largest beam diameter. The individual particle beam S3, which is most strongly focused, has the smallest beam diameter upon incidence on the second multi-aperture plate PA2. There was mid-range focusing for the individual particle beam S1, resulting in a mid-range beam diameter upon incidence on the second multi-aperture plate PA2. Depending on the focusing of the individual particle beams S1, S2, S3, there now is more or less pronounced masking or blocking of particles as a result of striking the second multi-aperture plate PA2. Thus, the number of charged particles that pass through the multi-aperture plate PA2 can be adjusted individually for each opening, and hence for each particle beam S1, S2, S3, by way of the preceding focusing in the first multi-lens array MLA1. Thus, the arrangement of the second multi-aperture plate downstream of the first multi-lens array PA1 ensures that individual current adjustment is possible for individual particle beams.

The second multi-lens array MLA2 is situated in the beam path downstream the second multi-aperture plate PA2 in the example shown. The second multi-lens array includes a second multiplicity of individually adjustable and focusing particle lenses and is arranged in the beam path of the particles or electrons downstream of the first multi-lens array MLA1 in such a way that at least some of the particles of the individual particle beams S1, S2, S3 which have passed through the first multi-lens array MLA1 also pass through the second multi-lens array MLA2. Here, there are appropriate assignments to the lenses of the first and second multi-lens array MLA1 and MLA2 for each individual particle beam S1, S2, S3. The number of lenses per array MLA1 and MLA2 can be identical and the lenses are arranged corresponding to one another. Using the lenses of the second multi-lens array MLA2, it is possible to individually correct the focus positions of the individual beams S1, S2, S3 in respect of the field curvature, possibly present overall, of the imaging in the primary beam path 13. After the passage through one or more field lenses FL1 . . . N there is focusing on the intermediate image plane 325. In the case of a sufficiently large refractive power of the particle lenses of the second multi-lens array MLA2, it is theoretically also possible for the field lens or the field lens system FL1 . . . N to be dispensed with.

Charged particles can also be successfully prevented here from striking and charging the surface of the second multi-lens array MLA2 as a result of the opening diameters $d_3$ in the second multi-aperture plate PA2 being smaller than the opening diameters $d_4$ in the second multi-lens array MLA2. Thus, in this case, too, the second multi-aperture plate PA2 develops its corresponding protective effect above the second multi-lens array MLA2. Moreover, in the case of appropriate dimensioning, possibly present lens defects, for example spherical aberrations, also have a less pronounced effect in this case in the second multi-lens array MLA2.

An adjustment of value for the current and focus position with the aid of a measuring device can be implemented in iterative fashion. By way of example, the desired focus position in the intermediate image plane 325 can be adjusted by way of the second multi-lens array MLA2 in a first step. Optionally, this can be implemented in the object plane 7 using a conventional method within the scope of electron microscopy, for example via a series focusing on a high-resolution sample, wherein the position of the beam waist along the beam direction is determined by way of a conventional method, for example via an edge steepness criterion or via a Fourier analysis. In a second step, the current per individual particle beam S1, S2, S3 is adjusted via the first multi-lens array MLA1 by way of an appropriate individual change in the refractive powers of the individual lenses of the first multi-lens array MLA1. Then, in a third step, the focus position in the intermediate image plane 325 can be readjusted by a corresponding individual change in the refractive powers of the individual lenses of the second multi-lens array MLA2 or by another, further multi-lens array MLA in order to compensate the displacement of the respective focus in the intermediate image plane 325 which results from the changes in the refractive powers of the first multi-lens array MLA1 and which is generally individual to each particle beam S1, S2, S3 such that the foci of all particle beams S1, S2, S3 are located in the intermediate image plane 325. To this end, it may be useful to apply the known sensitivities of the excitation strengths of each lens element of the first multi-lens array MLA1 and of the second multi-lens array MLA2 to the focus position.

To the extent that the second multi-lens array MLA2 should also compensate field curvature of the subsequent particle optical unit made of field lenses, beam splitter and objective lens, the intermediate image plane 325 is not an exact plane but a generally curved area which is then imaged in the object plane, with the field curvature being taken into account, by the subsequent particle optical unit. Even when adjusting or balancing the particle currents in the individual particle beams by changing the excitations of the individual lenses of the first multi-lens array MLA1, the post-correction is also implemented here by changing the excitations of the individual lenses of the second multi-lens array MLA2 in such a way that the foci of all individual particle beams S1, S2, S3 are located in the area that is imaged in the object plane by the subsequent particle optical unit when the field curvature is taken into account.

Thus, in conclusion, individual current adjustment can be implemented for each individual particle beam in a very simple and elegant manner using the embodiment variant illustrated in FIG. 2.

Figure 3:
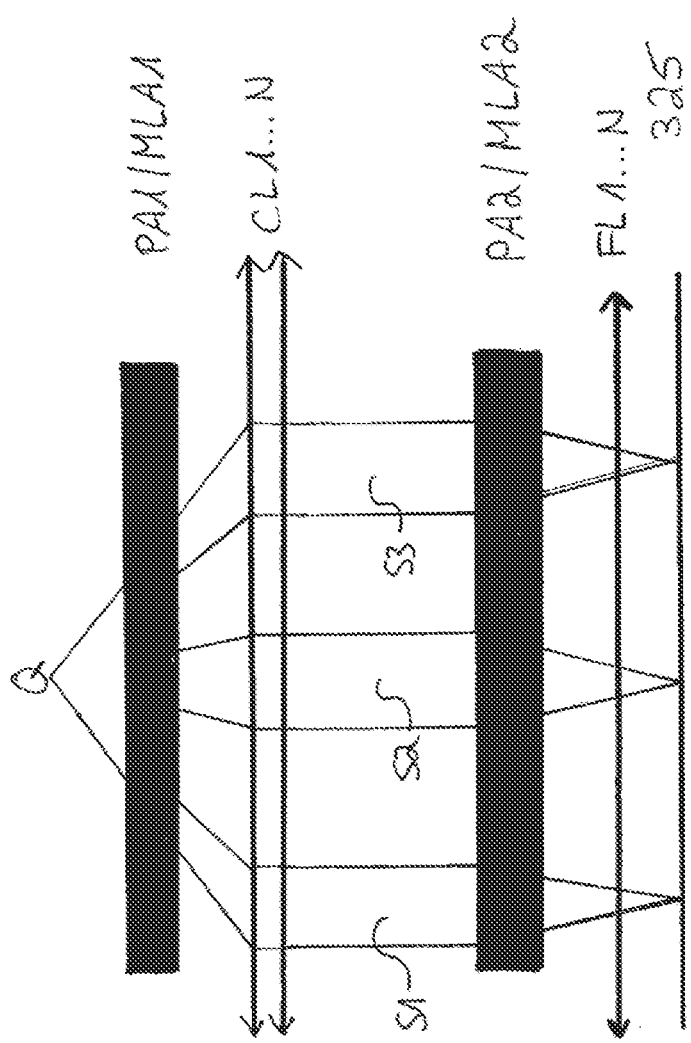
FIG. 3 shows a schematic diagram for a current adjustment of individual particle beams in accordance with a second embodiment.

FIG. 3 shows a schematic diagram for a current adjustment of individual particle beams S1, S2, S3 in accordance with a second embodiment of the disclosure. To simplify the illustration, a combination of multi-aperture plate and multi-lens array is merely illustrated here as a unit in the form of a dark box in the beam path. The second embodiment differs from the first embodiment by the position of the first multi-aperture plate PA1 and the first multi-lens array MLA1. In this case, both are already arranged above, i.e., on the source side of, the multiple condenser or double condenser CL1 . . . N. However, the first and second embodiment are otherwise identical. Alternatively, it would also be possible to separate the unit made of first multi-aperture plate PA1 and first multi-lens array MLA1 and arrange the constituent parts at other positions; by way of example, the first multi-aperture plate PA1 could be arranged between the lenses CL1 and CL2 of the multiple condenser, i.e., within the double condenser or multiple condenser, and the first multi-lens array 1 could then be arranged between the second condenser lens CL2 and the second multi-aperture plate PA2. However, the functionality of the optical elements remains the same in principle.

Figure 4:
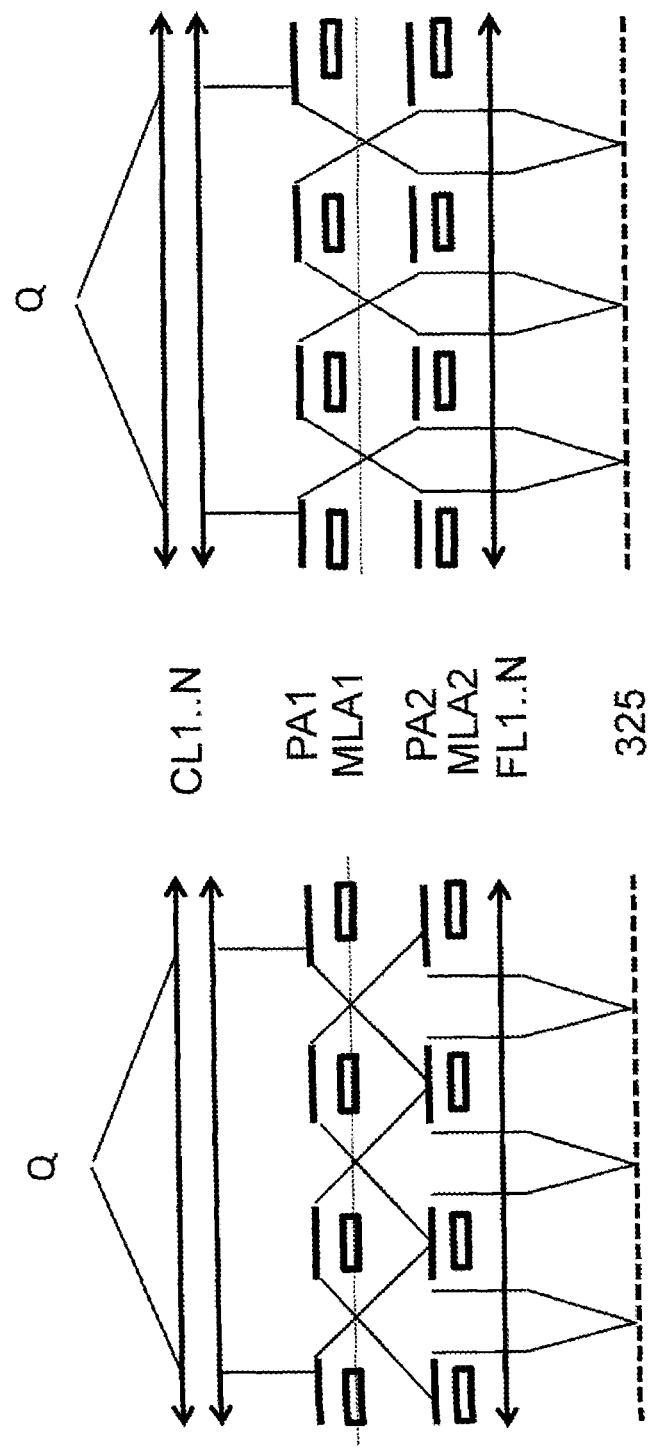
FIG. 4 shows a schematic diagram for a current adjustment of individual particle beams in accordance with a third embodiment.

FIG. 4 shows a schematic diagram for a current adjustment of individual particle beams in accordance with a third embodiment of the disclosure. Since the principle of individual current adjustment has already been described in great detail on the basis of the first embodiment, the schematic diagram in FIG. 4 has also been kept very simple in this case and only the peculiarities of this embodiment variant and its differences from the embodiment variants already described above will be discussed below. The left of the image shows the case of very strong focusing by the first multi-lens array while the right of the image shows less strong focusing of the individual particle beams by the first multi-lens array MLA1. The optical elements used in this third embodiment variant are, in principle, the same as in the first embodiment. In principle, their positioning is also comparable with the first embodiment. However, a difference herein lies in the refractive power of the particle lenses of the first multi-lens array MLA1. The focusing effect of individual particle lenses of the first multi-lens array is so strong in this case that an intermediate image is generated in each individual particle beam between the first multi-lens array MLA1 and the second multi-lens array MLA2, i.e., each individual particle beam has an intermediate focus, i.e., a beam waist, between the first multi-lens array MLA1 and the second multi-lens array MLA2. However, even if such an intermediate focus is generated in each individual particle beam, it is also the case that, depending on the strength of the focusing in the first multi-lens array MLA1, it is possible to adjust how many particles strike the second multi-aperture plate PA2 and are absorbed there or how many particles pass through the openings in the second multi-aperture plate PA2. In the shown example, more particles are blocked by the second multi-aperture plate PA2 to the left of the image than in the case shown to the right of the image, for example. Subsequently, the second multi-lens array MLA2 can once again correct a different position of the beam foci in or in the vicinity of the intermediate image plane 325 caused by the individual setting of the individual lenses of the first multi-lens array MLA1 and/or compensate possibly present field curvature. After the passage through one or more field lenses FL1 . . . N there is imaging or focusing of the individual particle beams on the intermediate image plane 325.

Figure 5:
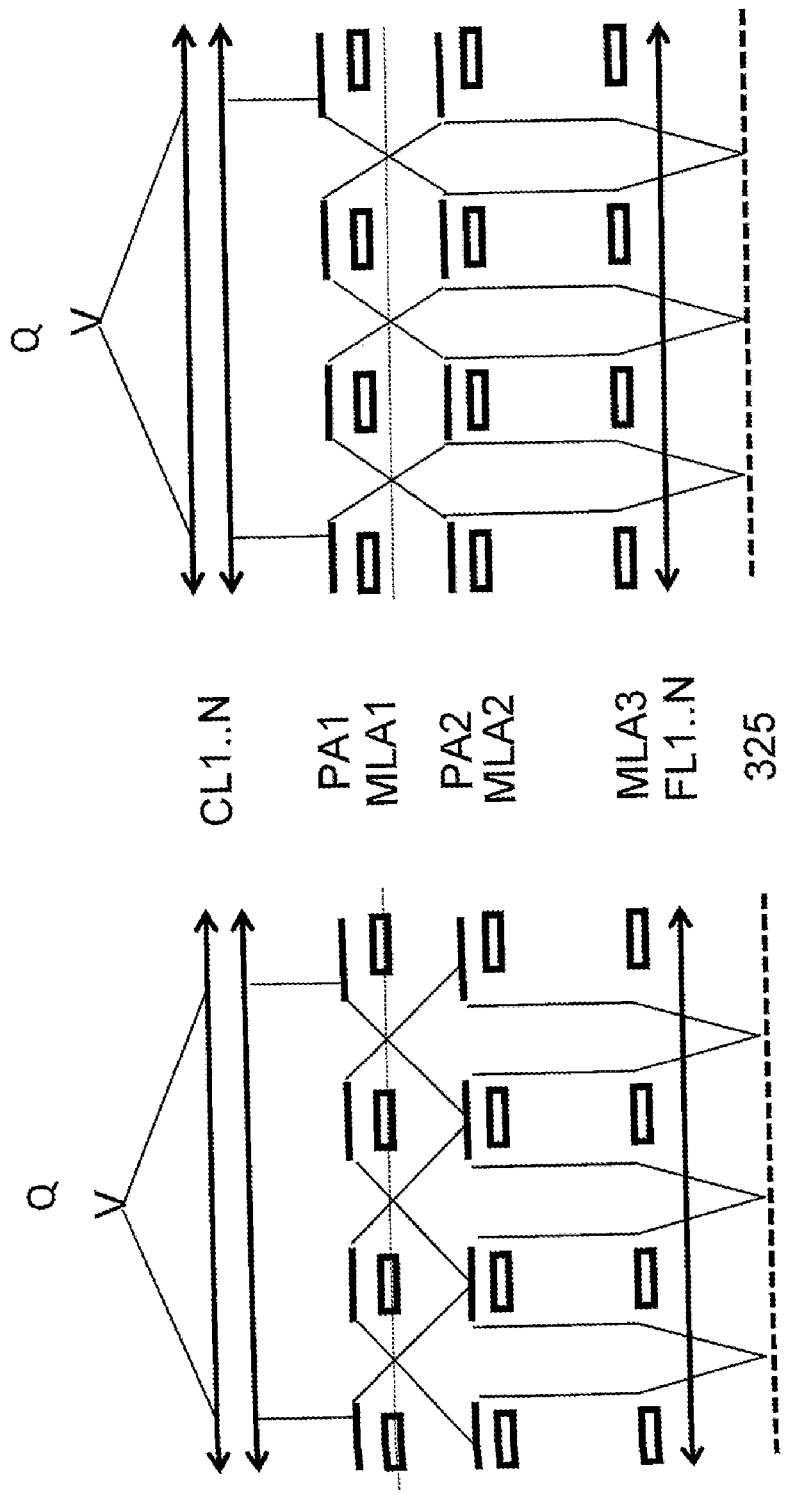
FIG. 5 shows a schematic diagram for a current adjustment of individual particle beams in accordance with a fourth embodiment.

FIG. 5 shows a schematic diagram for a current adjustment of individual particle beams in accordance with a fourth embodiment of the disclosure. The fourth embodiment differs from the third embodiment, which is shown in FIG. 4, by virtue of a third multi-lens array MLA3 additionally being provided in the beam direction downstream of the second multi-lens array MLA2. The particle lenses of the second multi-lens array MLA2 exert their focusing effect on the individual particle beams only to such an extent here that the individual particle beams are respectively collimated downstream of the second multi-lens array MLA2 in the beam direction and these collimated individual particle beams then pass through the subsequently arranged third multi-lens array MLA3. Then, a possibly present field curvature of the subsequent particle-optical unit can be corrected by the multiplicity of individually adjustable and focusing particle lenses in the third multi-lens array MLA3. Then, the individual particle beams are focused in turn on the intermediate image plane 325 by one or more field lenses FL1 . . . N; however, these field lenses could also be dispensed with in the case of an appropriate refractive power of the particle lenses of the third multi-lens array MLA3. In this last-mentioned case, the refractive powers of the individual lenses of the third multi-lens array are then set in such a way that each individual lens of the third multi-lens array focuses the particle beam passing through it in the intermediate image plane 325 or—if field curvature of the subsequent particle-optical unit is corrected—focuses the particle beam into the area which is imaged in the object plane by the subsequent particle-optical unit.

Figure 6:
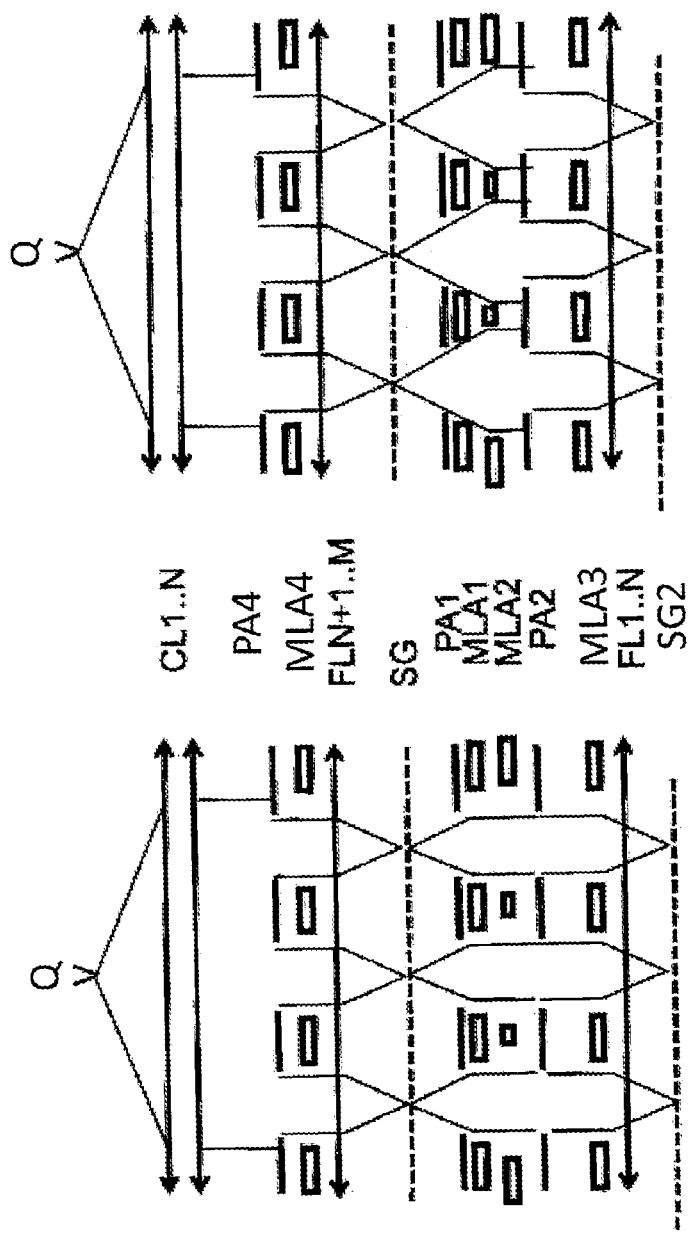
FIG. 6 shows a schematic diagram for a current adjustment of individual particle beams in accordance with a fifth embodiment.

FIG. 6 shows a schematic diagram for a current adjustment of individual particle beams in accordance with a fifth embodiment of the disclosure. Once again, the first multi-lens array MLA1 and the second multi-aperture plate PA2 are the constituent parts for adjusting the individual beam currents per se. Here, in this fifth embodiment, the first multi-aperture plate PA1, the first multi-lens array MLA1, the second multi-lens array MLA2 and the second multi-aperture plate PA2 and also an additionally provided third multi-lens array MLA3 with subsequent field lenses FL1 . . . N are only arranged downstream of the intermediate image plane SG in the beam direction. For the purposes of focusing on this intermediate image plane SG, the charged particles emanating from the particle source Q initially pass the multiple condenser CL1 . . . N and then strike a fourth multi-aperture plate PA4, which is the multi-aperture plate arranged closest to the particle source Q at the same time, as a result of which individual particle beams are formed. These individual particle beams thereupon pass through the fourth multi-lens array MLA4 and a first field lens group FL1 . . . N arranged thereafter and are imaged on the intermediate image plane SG as a result. Only then are the individual currents of the individual particle beams set via a series arrangement of a first multi-aperture plate PA1, a first multi-lens array MLA1, a second multi-lens array MLA2 and a second multi-aperture plate PA2, which are arranged downstream of the intermediate image plane SG in the beam direction. Like in the embodiments described above, a third multi-lens array and a second field lens group FL1 . . . N can be arranged downstream of the second multi-aperture plate PA2 in the beam direction in order to generate beam foci in each individual particle beam in a second intermediate image plane SG2.

What should be highlighted in this embodiment variant is that the first multi-lens array MLA1 and the second multi-lens array MLA2 are arranged immediately in succession and in front of the second multi-aperture plate PA2. As a result, the lenses of the first multi-lens array MLA1 and of the second multi-lens array MLA2 form a type of "micro-double condenser" and the individual lenses of the mutually corresponding lenses of the first multi-lens array MLA1 and of the second multi-lens array MLA2, i.e., the lenses of the two multi-lens arrays which are passed through by the same individual particle beams, are excited in such a way in combination that the individual particle beams always strike the second multi-aperture plate PA2 in a manner substantially directed in parallel, i.e., in collimated fashion. The refractive powers of the third multi-lens array MLA3, which follows in the beam direction, and/or of the following second field lens system need not be varied for the generation of the beam foci in the second intermediate image plane SG2, even when the refractive powers of the first multi-lens array MLA1 and of the second multi-lens array MLA2 are altered for the purposes of current adjustment in the individual particle beams, and can instead be operated with constant refractive power. What this achieves is that the beam foci in all individual particle beams are generated under telecentricity conditions that are uniform and constant for all individual particle beams and generated with the same numerical aperture despite the current adjustment.

Possibly present field curvature of the subsequent particle-optical unit can once again be corrected by the third multi-lens array MLA3, as already described above. In the case of appropriate refractive power of the particle lenses of the third multi-lens array MLA3, it may also be possible to dispense with the subsequent field lenses FL1 . . . N. Then, there is imaging on a second intermediate image plane SG2.

Figure 7:
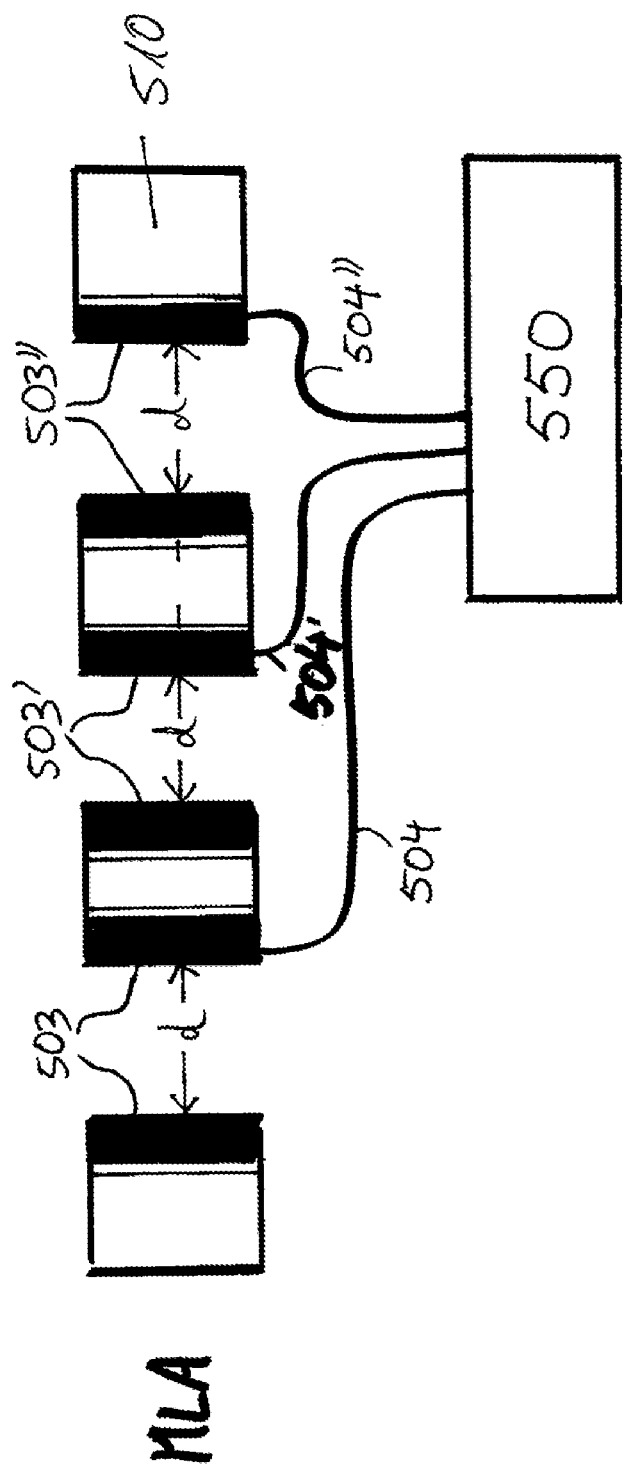
FIG. 7 schematically shows the structure of a multi-lens array with ring electrodes.

FIG. 7 shows a schematic illustration of an embodiment variant for a multi-lens array MLA, which is how the various multi-lens arrays MLA1 to MLA4 could be constructed within the scope of the disclosure. The multi-lens array MLA includes a lens multi-aperture plate 510 with a multiplicity of openings with the diameter d. As a rule, the diameter d of the openings is identical for all individual lenses of the multi-lens array. Moreover, the multi-lens array MLA includes a multiplicity of electrodes 503, 503' and 503", with these being ring electrodes in the example shown. A ring electrode 503, 503' and 503" is arranged at each opening of the lens multi-aperture plate 510 in a manner insulated from the lens multi-aperture plate 510 in order to individually influence the individual particle beam passing through the respective opening. To this end, associated lines 504, 504' and 504" are provided for each electrode 503, 503' and 503" for the purposes of supplying a voltage, the lines leading to a controller 550. This controller 550 can in each case individually set the voltage to be applied to the electrodes 503, 503' and 503" of the one multi-lens array MLA or the plurality of multi-lens arrays MLAs. The counter electrode or counter electrodes with which each ring electrode 503, 503' and 503" interacts in order to form an electrostatic lens by way of an electrostatic acceleration or retardation field is/are not illustrated in FIG. 7. The multi-lens array MLA can be produced, for example, with the aid of methods conventional in microstructure technology, e.g., the combination of lithography methods with subsequent etching and/or deposition methods.

Reference is made to the fact that components of the controller 550 can also be arranged immediately on the lens multi-aperture plate 510 and so some of the lines 504, 504' and 504" for the voltage supply can also be realized as conductor tracks on or in the lens multi-aperture plate 510. As a result, the number of supply lines between an external controller and the multi-lens array, which is arranged within the vacuum column of the particle beam apparatus, can be reduced.

Figure 8:
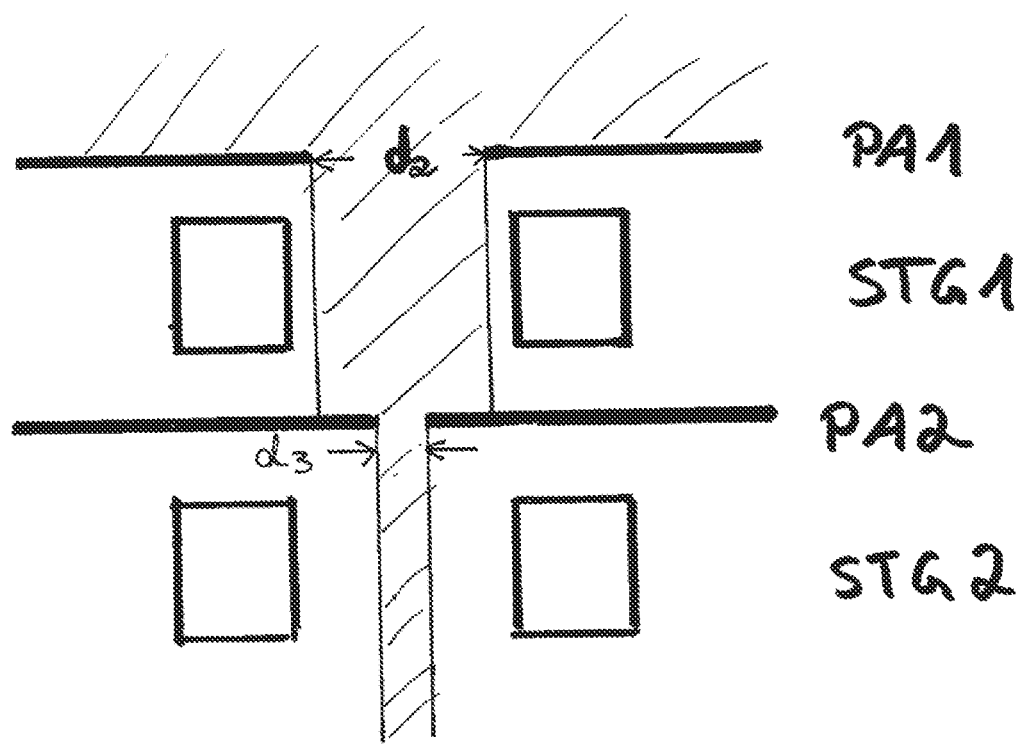
FIG. 8 shows a schematic diagram for a current adjustment of individual particle beams in accordance with a sixth embodiment of the disclosure with the aid of stigmators.

FIG. 8 schematically shows a schematic diagram for a current adjustment of individual particle beams in accordance with a sixth embodiment with the aid of stigmators. The arrangement for current adjustment in accordance with this embodiment includes a first source-side or condenser-side first multi-aperture plate PA1, a first multi-stigmator STG1 following in the beam direction of the particle beam, a second multi-aperture plate PA2 following the first multi-stigmator STG1 in the beam direction and a second multi-stigmator STG2 following the second multi-aperture plate PA2. A particle beam emerging from the condenser (not illustrated here) initially strikes the multi-aperture plate PA1 or in part passes through the openings in the same. The multiplicity of individual particle beams are formed in this way. Then, the individual particle beam passes through the first multi-stigmator STG1 and subsequently strikes a multi-aperture plate PA2 with a multiplicity of appropriate openings, when the opening diameter $d_3$ of the openings in the second multi-aperture plate PA2 is smaller than the diameter $d_2$ of the openings in the first multi-aperture plate PA1. Accordingly, the diameter of the particle beams formed by the first multi-aperture plate PA1 is greater than the opening diameter $d_3$ of the openings in the second multi-aperture plate PA2. As a result of the individual particle beam partly striking the plate and partly passing through the opening with the diameter $d_3$, it is now possible again to take out or block a certain number of particles from the individual particle beam. The remaining particles of the individual particle beam then pass through the second multi-stigmator STG2 and subsequently pass through further particle-optical components (not illustrated).

Figure 9A:
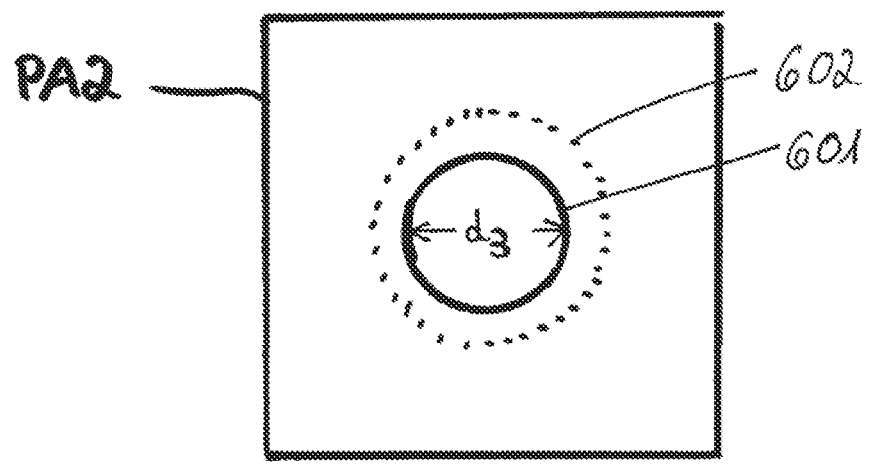
FIGS. 9A and 9B schematically illustrates the mode of operation of the stigmators.
Figure 9B:
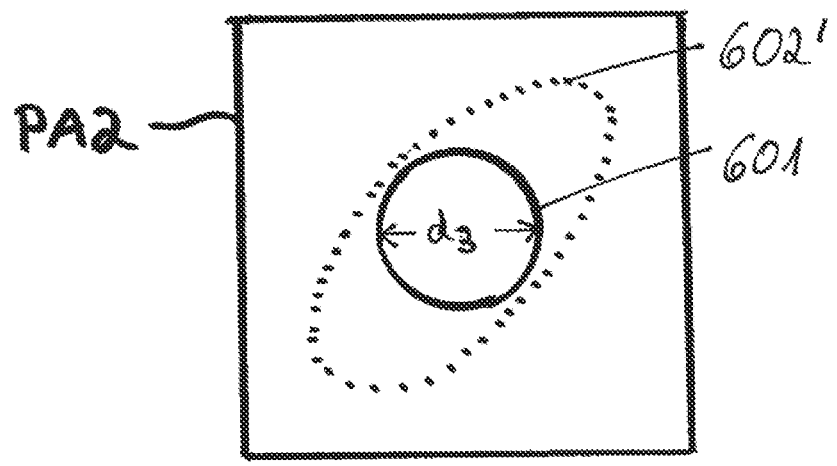

The principle mode of operation of the multi-stigmators is illustrated in FIGS. 9A-9B in turn. Here, FIG. 9A) shows a state in which the first multi-stigmator STG1 in FIG. 8 is deactivated and FIG. 9B) shows a state in which the first multi-stigmator STG1 of FIG. 8 is activated. Illustrated in each case is a plan view of the second multi-aperture plate PA2 with the opening 601, the opening diameter of which is $d_3$. Moreover, the illumination spot 602 and 602', respectively, of the individual particle beam is illustrated. The illumination spot 602 is substantially round in the case of a deactivated state of the first multi-stigmator STG1 (FIG. 9A)). By contrast, the illumination spot 602' is substantially elliptically distorted when the first multi-stigmator STG1 is activated. Thus, depending on whether or not the first multi-stigmator STG1 is activated or how strongly it is excited, it is possible to set how many of the incoming particles in the individual particle beam actually pass through the opening 601 in the second multi-aperture plate PA2. Thus, the current of each individual particle beam can be adjusted in this way.

For the subsequent imaging of the individual particle beams, it is desirable to subsequently compensate again the stigmation brought about by the individual stigmators of the first multi-stigmator STG1. To this end, the second multi-stigmator STG2 is provided downstream of the second multi-aperture plate PA2, the stigmators, i.e., multi-poles, of the second multi-stigmator being excited in such a way on the basis of the stigmation generated by the associated stigmator of the first multi-stigmator STG1 that each stigmator of the second multi-stigmator STG2 exactly compensates the astigmatism generated by the assigned stigmator of the first multi-stigmator STG1 through which the same individual particle beam passed. After this, the individual particle beam has practically no astigmatism any more.

By way of example, the individual stigmators of the multi-stigmators STG1 and STG2 can be embodied as quadrupoles or as octupoles. In principle, the use of quadrupoles is sufficient. However, if the stigmators are embodied as octupoles, it is possible to alter an orientation of the generated quadrupole as desired, and so a plurality of stigmation directions are consequently available.

A feature of using multi-stigmators in the manner specified above in comparison with a multi-lens array with a focusing effect lies in the fact that lower voltages are required for influencing individual particle beams in the case of stigmators than in the case of lenses of a multi-lens array. However, instead of using at least one multi-lens array, work has to be carried out with at least two multi-stigmators STG1 and STG2.

Figure 10:
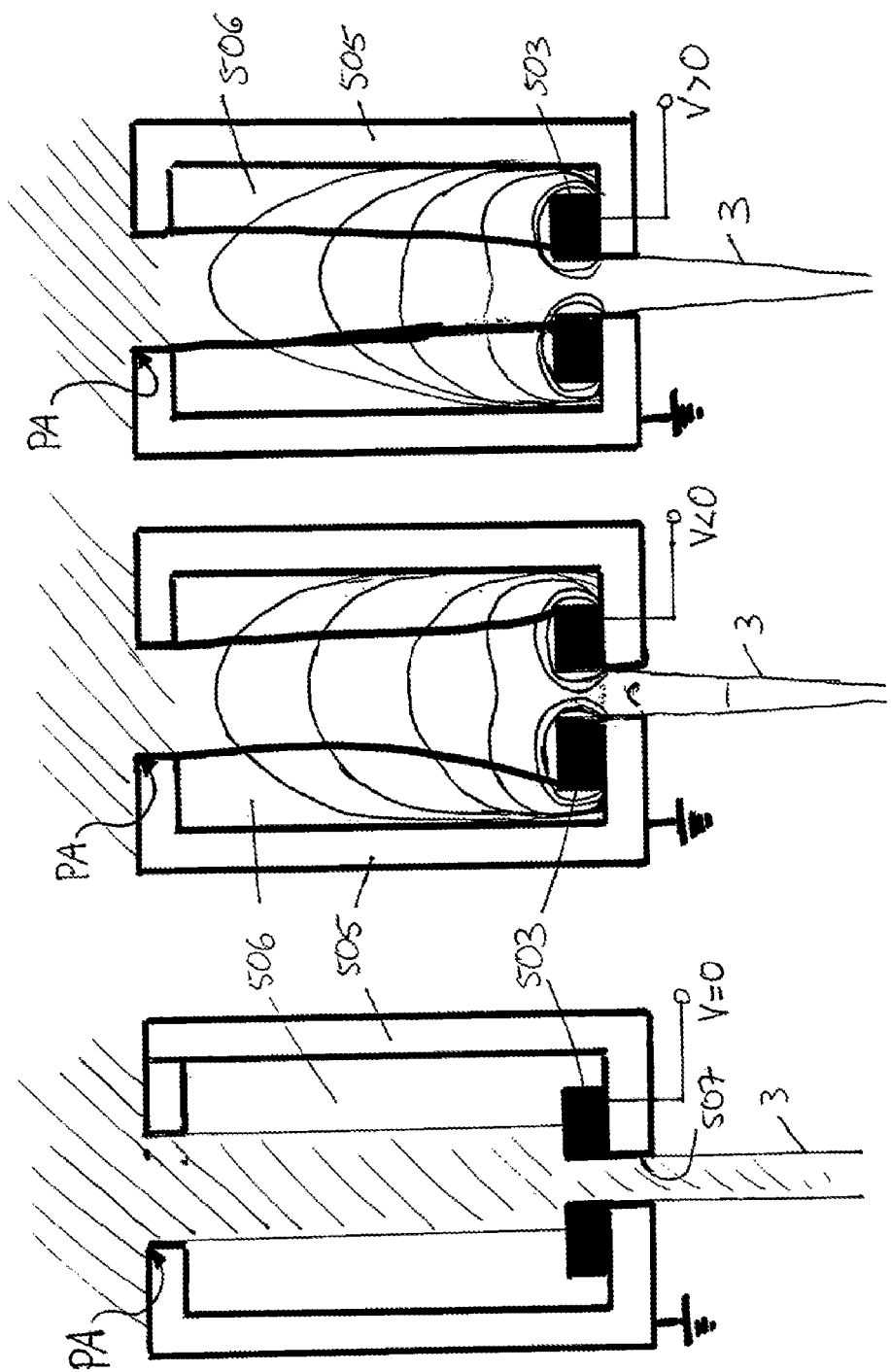
FIG. 10 schematically illustrates an alternative example for a current adjustment.

FIG. 10 illustrates an alternative example for current adjustment with the aid of an alternative embodiment of a multi-lens array. In this embodiment, each individual electrostatic lens of the multi-lens array includes a cylindrical shield 505, the cylinder axis of which is aligned parallel to the beam axis of the individual particle beams. A ring electrode 503 is arranged within the cylindrical shield 505 of each individual lens of the multi-lens array, the ring electrode 503 being electrically insulated from the shield 505 and a different electrical potential being able to be applied to the ring electrode for each individual lens of the multi-lens array.

In the example shown, the ring electrodes 503 are each arranged at the base of the cylindrical shield 505. In this case, the cylindrical shield 505 lies at a first potential, which is arbitrarily assumed to be the zero potential in this case. At the top, the cylindrical shield 505 has an opening or aperture PA, through which an individual particle beam 3 enters into a cavity 506 of the cylindrical shield 505. The individual particle beam 3 traverses the cavity 506 and leaves the latter after passing the ring electrode 503, which is arranged at the base of the shield 505, through a further opening 507. The number of charged particles in the individual particle beam 3 when leaving the shield depends on the potential applied to the ring electrode 503 relative to the potential of the shield 505.

FIG. 10, left, shows the case where no voltage is applied to the ring electrode 503; i.e., the ring electrode 503 lies at the same electrostatic potential as the shield 505 (V=0). The individual particle beam 3, which consists of negatively charged particles such as, e.g., electrons in the example shown in FIG. 10, therefore passes through the cavity 506 without deflection; the beam diameter thereof is only cropped by the opening diameter of the ring electrode 503. Here, the ring electrode 503 is not shielded and some of the particles strike the ring electrode 503 while others pass through it. Thus, the ring electrode 503 additionally adopts the function of a beam-restricting aperture.

FIG. 10, center, shows the situation where an electrostatic potential that is lower than the electrostatic potential of the shield 505 is applied to the ring electrode 503, the electrostatic potential therefore having a retarding effect on the particles in the individual particle beam (V<0). As a result, the individual particle beam 3 is widened as it passes through the cavity 506 until it strikes the surface of electrode 503. Consequently, there are quantitatively more particles that strike the electrode 503 and are masked from the individual particle beam 3 than in the initial case where ring electrode 503 and shield 503 are at the same electrostatic potential (V=0). Nevertheless, the individual particle beam 3 emerging from the cylindrical shield 505 then is focused again because the particles that pass through the ring electrode 503 are subsequently accelerated back to the electric potential of the shield 505.

FIG. 10, right, shows the situation where an electrostatic potential that is higher than the electrostatic potential of the shield 505 is applied to the ring electrode 503, the electrostatic potential therefore having an accelerating effect on the particles in the individual particle beam (V>0). As a result, the individual particle beam 3 is focused as it passes through the cavity 506 until it strikes the surface of the electrode 503. Consequently, quantitatively fewer particles strike electrode 503 and are masked from the individual particle beam 3 than in the case where the ring electrode 503 and shield 503 are at the same electrostatic potential (V=0). The individual particle beam emerging from the cylindrical shield is likewise focused again.

If positively charged particles are used instead of negatively charged particles, the effects shown in the center and to the right in FIG. 10 are interchanged: In the case of V<0 there is focusing and in the case of V>0 there is widening of the individual particle beam 3.

What is claimed is:

1. A multi-beam particle microscope, comprising:
a particle source configured to generate a beam of charged particles;

a first multi-lens array comprising a first multiplicity of individually adjustable and focusing particle lenses in a beam path of the charged particles so that at least some of the charged particles pass through openings in the first multi-lens array in the form of a plurality of individual charged particle beams;

a first multi-aperture plate comprising a multiplicity of second openings in the beam path of the charged particles downstream of the first multi-lens array so that: i) some of the charged particles which pass the first multi-lens array impinge on the first multi-aperture plate and are absorbed by the first multi-aperture plate; and ii) some of the charged particles which pass the first multi-lens array also pass through the openings in the first multi-aperture plate; and a controller configured to supply an individually adjustable voltage to the particle lenses of the first multi-lens array to adjust the focusing of an associated particle lens for each individual charged particle beam, thereby adjusting, for each individual charged particle beam: i) a beam diameter of the individual charged particle beam when it impinges on the first multi-aperture plate to adjust ii) a number of charged particles in the individual charged particle beam that is blocked by the first multi-aperture plate; iii) a number of charged particles in the individual charged particle beam that pass through the respective second opening in the first multi-aperture plate; and iv) a current of the individual charged particle beam downstream of the first multi-aperture plate, wherein the multi-beam particle microscope is configured so that the plurality of individual charged particle beams is incident an object plane of the multi-beam particle microscope.

2. The multi-beam particle microscope of claim 1, further comprising a second multi-aperture plate comprising a multiplicity of first openings, wherein the second multi-aperture plate is arranged in the beam path of the charged particles upstream of the first multi-lens array, and a diameter of the first openings is less than a diameter of the openings in the first multi-lens array so that charged particles which pass through the second multi-aperture plate also pass through the first multi-lens array.

3. The multi-beam particle microscope of claim 1, further comprising a second multi-lens array comprising a second multiplicity of individually adjustable and focusing particle lenses,
wherein:
the second multi-lens array is in the beam path of the charged particles downstream of the first multi-lens array so that at least some of the charged particles of the individual charged particle beams that pass through the first multi-lens array also pass through the second multi-lens array;
there are assignments to the lenses of the first and second multi-lens array for the individual charged particle beams;
the controller is configured to supply an individually adjustable voltage to the particle lenses of the second multi-lens array to individually adjust the focusing of the associated particle lens for each individual charged particle beam.

4. The multi-beam particle microscope of claim 3, wherein the second multi-lens array is in the beam path downstream of the first multi-aperture plate.

5. The multi-beam particle microscope of claim 3, wherein the second multi-lens array is in the beam path upstream of the first multi-aperture plate.

6. The multi-beam particle microscope of claim 3, wherein a diameter of the second openings in the first multi-aperture plate is less than a diameter of the openings in the second multi-lens array.

7. The multi-beam particle microscope of claim 1, further comprising a multiple condenser.

8. The multi-beam particle microscope of claim 7, wherein the first multi-lens array is in the beam path downstream of the multiple condenser, and the first multi-lens array is in the beam path upstream of the first multi-aperture plate.

9. The multi-beam particle microscope of claim 7, wherein the first multi-lens array is in the beam path upstream of the multiple condenser.

10. The multi-beam particle microscope of claim 2, further comprising a multiple condenser wherein the second multi-aperture plate is between constituent parts of the multiple condenser, the first multi-lens array is downstream of the multiple condenser, and the first multi-lens array is upstream of the first multi-aperture plate.

11. The multi-beam particle microscope of claim 1, further comprising a particle-optical lens configured to focus the individual charged particle beams on an intermediate image plane.

12. The multi-beam particle microscope of claim 11, wherein the particle-optical lens comprises a field lens.

13. The multi-beam particle microscope of claim 11, further comprising a second multi-lens array comprising a second multiplicity of individually adjustable and focusing particle lenses,
wherein:
the second multi-lens array is in the beam path of the charged particles downstream of the first multi-lens array so that at least some of the charged particles of the individual charged particle beams that pass through the first multi-lens array also pass through the second multi-lens array; and
there are assignments to the lenses of the first and second multi-lens array for the individual charged particle beams, the controller is configured to supply an individually adjustable voltage to the particle lenses of the second multi-lens array to individually adjust the focusing of the associated particle lens for each individual charged particle beam, and
wherein the particle-optical lens is defined by the second multi-lens array.

14. The multi-beam particle microscope of claim 11, wherein the first multi-lens array and the first multi-aperture plate are in the beam path upstream of the intermediate image plane.

15. The multi-beam particle microscope of claim 11, wherein the first multi-lens array and the first multi-aperture plate are in the beam path downstream of the intermediate image plane.

16. The multi-beam particle microscope of claim 3, wherein the individually adjustable voltages of the particle lenses of the first multi-lens array are configured so that an intermediate image is between the first multi-lens array and the second multi-lens array.

17. The multi-beam particle microscope of claim 3, further comprising a third multi-lens array which comprising third multiplicity of individually adjustable and focusing particle lenses, wherein:
the third multi-lens array is in the beam path of the charged particles downstream of the first multi-lens array and downstream of the second multi-lens array so that at least some of the charged particles of the individual particle charged beams that pass through the first and the second multi-lens array also pass through the third multi-lens array;
there are assignments to the lenses of the first, second and third multi-lens array for the individual particle beams; and
the controller is configured to supply an individually adjustable voltage to the particle lenses of the third multi-lens array to individually adjust the focusing of the associated particle lens for each individual charged particle beam.

18. The multi-beam particle microscope of claim 17, furthermore comprising:
a second multi-aperture plate comprising a multiplicity of fourth openings; and
a fourth multi-lens array comprising a fourth multiplicity of individually adjustable and focusing particle lenses, the fourth multi-lens array in the beam path of the charged particles downstream of the second multi-aperture plate,
wherein:
the second multi-aperture plate and the fourth multi-lens array are in the beam path on a source side of the first multi-lens array;
the second multi-aperture plate and the fourth multi-lens array are configured with respect to one another so that charged particles which pass through the second multi-aperture plate also pass through the fourth multi-lens array; and
the controller is configured to supply an individually adjustable voltage to the particle lenses of the fourth multi-lens array to individually adjust the focusing of the associated particle lens for each individual charged particle beam.

19. The multi-beam particle microscope of claim 18, wherein at least one member selected from the group consisting of the first multi-lens array, the second multi-lens array, the third multi-lens array and/or the fourth multi-lens array comprises a lens multi-aperture plate with a multiplicity of openings, a multiplicity of electrodes,
wherein, at each of the multiplicity of openings, at least one of the multiplicity of electrodes is arranged in a manner insulated from the lens multi-aperture plate to individually influence the individual charged particle beam passing through the respective opening.

20. The multi-beam particle microscope of claim 19, wherein the electrodes comprise ring electrodes.

21. The multi-beam particle microscope of claim 1, further comprising a measuring device configured to measure a current of the individual charged particle beams.

22. The multi-beam particle microscope of claim 21, wherein the measuring device is configured so that a measurement of the current is implementable for a multiplicity of the individual charged particle beams at the same time.

23. The multi-beam particle microscope of claim 21, wherein the measuring device comprises a Faraday cup.

24. A method, comprising:
providing a multi-beam particle microscope according to claim 1; and
using the first multi-lens array to adjusted individual beam currents for a plurality of individual charged particle beams.

* * * * *

UNITED STATES PATENT AND TRADEMARK OFFICE
CERTIFICATE OF CORRECTION

PATENT NO. : 11,562,880 B2
APPLICATION NO. : 17/209626
DATED : January 24, 2023
INVENTOR(S) : Dirk Zeidler et al.

It is certified that error appears in the above-identified patent and that said Letters Patent is hereby corrected as shown below:

In the Specification

Column 19, Line 11, delete "FIG. 9A)" insert -- FIG. 9A --.

Column 19, Line 13, delete "FIG. 9B)" insert -- FIG. 9B --.

In the Claims

Column 21, Line 24, Claim 1, after "adjust" insert -- ; --.

Column 22, Line 33, Claim 13, delete "beams," insert -- beams; --.

Signed and Sealed this
Fourteenth Day of March, 2023

Katherine Kelly Vidal
*Director of the United States Patent and Trademark Office*